US012211738B2

(12) United States Patent
Tsai et al.

(10) Patent No.: US 12,211,738 B2
(45) Date of Patent: Jan. 28, 2025

(54) SEMICONDUCTOR STRUCTURE AND MANUFACTURING METHOD THEREOF

(71) Applicant: Taiwan Semiconductor Manufacturing Company, Ltd., Hsin-Chu (TW)

(72) Inventors: Yung-Chih Tsai, Jhudong Township (TW); Wei-Che Hsu, Tainan (TW); Yu-Chung Yang, Hsinchu (TW); Alexander Kalnitsky, San Francisco, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 447 days.

(21) Appl. No.: 17/590,260

(22) Filed: Feb. 1, 2022

(65) Prior Publication Data

US 2022/0157647 A1    May 19, 2022

Related U.S. Application Data

(63) Continuation of application No. 16/203,853, filed on Nov. 29, 2018, now Pat. No. 11,244,857, which is a
(Continued)

(51) Int. Cl.
*H01L 21/768*     (2006.01)
*H01L 23/522*     (2006.01)
(Continued)

(52) U.S. Cl.
CPC .... *H01L 21/7682* (2013.01); *H01L 21/76805* (2013.01); *H01L 21/76895* (2013.01);
(Continued)

(58) Field of Classification Search
CPC .......... H01L 21/7682; H01L 21/76805; H01L 21/76895; H01L 23/5222; H01L 23/5283;
(Continued)

(56) References Cited

U.S. PATENT DOCUMENTS 6,703,314 B2 *   3/2004   Lee ................... H01L 21/31116
                                                              257/E21.507
7,033,926 B2     4/2006   Schindler et al.
(Continued)

FOREIGN PATENT DOCUMENTS

CN           101266948 A        9/2008

OTHER PUBLICATIONS

Non-Final Office Action dated Dec. 20, 2016 for U.S. Appl. No. 15/168,822.
(Continued)

*Primary Examiner* — Britt D Hanley
*Assistant Examiner* — Vicki B. Booker
(74) *Attorney, Agent, or Firm* — Eschweiler & Potashnik, LLC

(57) ABSTRACT

A semiconductor structure includes a substrate and a dielectric material disposed over the substrate. A void is disposed within the dielectric material. A dielectric liner is disposed along inner sidewalls of the dielectric material proximate to the void. An inner surface of the dielectric liner defines an outer extent of the void, and the dielectric liner includes an inner liner layer and an outer liner layer.

20 Claims, 20 Drawing Sheets

Related U.S. Application Data continuation of application No. 15/168,822, filed on May 31, 2016, now Pat. No. 10,157,778.

(51) Int. Cl.
 *H01L 23/528* (2006.01)
 *H01L 23/532* (2006.01)
 *H01L 23/535* (2006.01)

(52) U.S. Cl.
 CPC ...... *H01L 23/5222* (2013.01); *H01L 23/5283* (2013.01); *H01L 23/5329* (2013.01); *H01L 23/53295* (2013.01); *H01L 23/535* (2013.01)

(58) Field of Classification Search
 CPC ........... H01L 23/5329; H01L 23/53295; H01L 23/535
 See application file for complete search history.

(56) References Cited

U.S. PATENT DOCUMENTS

| | | | |
|---|---|---|---|
| 9,263,392 B1 | 2/2016 | Lin et al. | |
| 2004/0121577 A1 | 6/2004 | Yu et al. | |
| 2004/0232496 A1* | 11/2004 | Chen | H10B 41/30 257/E27.103 |
| 2011/0193143 A1 | 8/2011 | Loechelt et al. | |
| 2011/0193160 A1 | 8/2011 | Loechelt et al. | |
| 2012/0037962 A1 | 2/2012 | Breyta et al. | |
| 2012/0074484 A1* | 3/2012 | Kang | H10B 41/40 257/E21.422 |
| 2014/0027822 A1 | 1/2014 | Su et al. | |
| 2015/0194333 A1 | 7/2015 | You et al. | |
| 2016/0141240 A1 | 5/2016 | Saka et al. | |
| 2017/0330832 A1 | 11/2017 | He et al. | |

OTHER PUBLICATIONS

Final Office Action dated Jun. 23, 2017 for U.S. Appl. No. 15/168,822.
Non-Final Office Action dated Nov. 17, 2017 for U.S. Appl. No. 15/168,822.
Final Office Action dated Jul. 27, 2018 for U.S. Appl. No. 15/168,822.
Notice of Allowance dated Oct. 22, 2018 for U.S. Appl. No. 15/168,822.
Non-Final Office Action dated Apr. 16, 2020 for U.S. Appl. No. 16/203,853.
Non-Final Office Action dated Nov. 18, 2020 for U.S. Appl. No. 16/203,853.
Final Office Action dated Jul. 9, 2021 for U.S. Appl. No. 16/203,853.
Notice of Allowance dated Sep. 30, 2021 for U.S. Appl. No. 16/203,853.

* cited by examiner

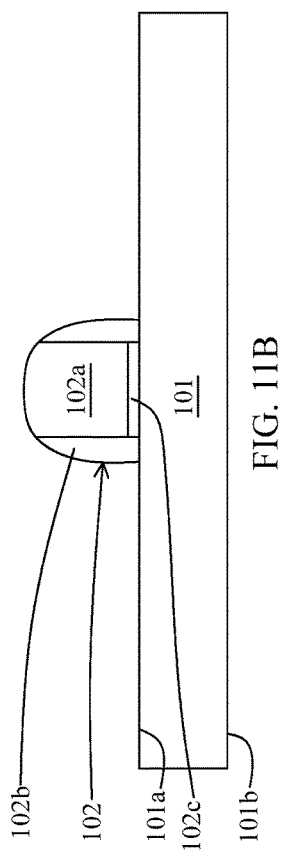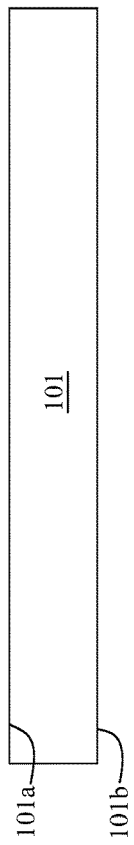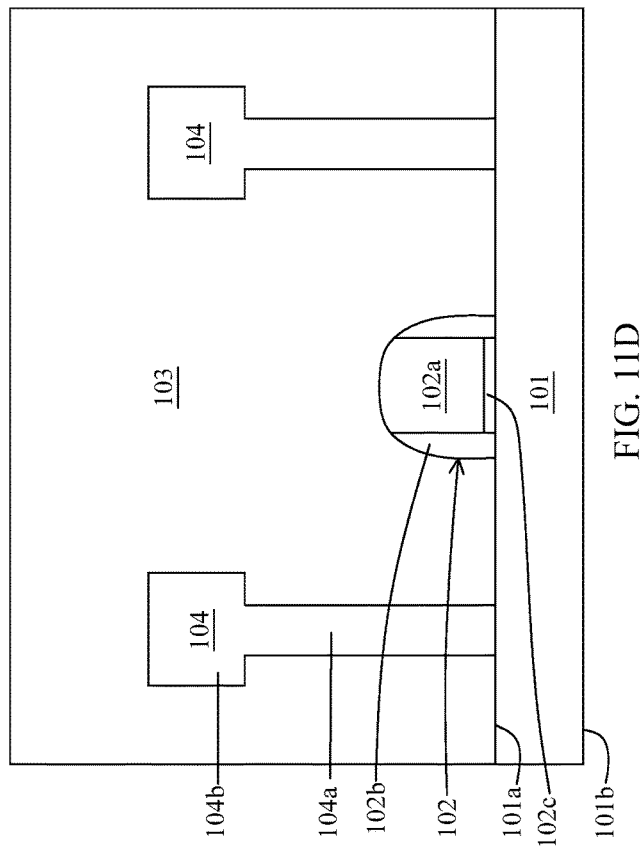
FIG. 11A
FIG. 11B
FIG. 11C
FIG. 11D

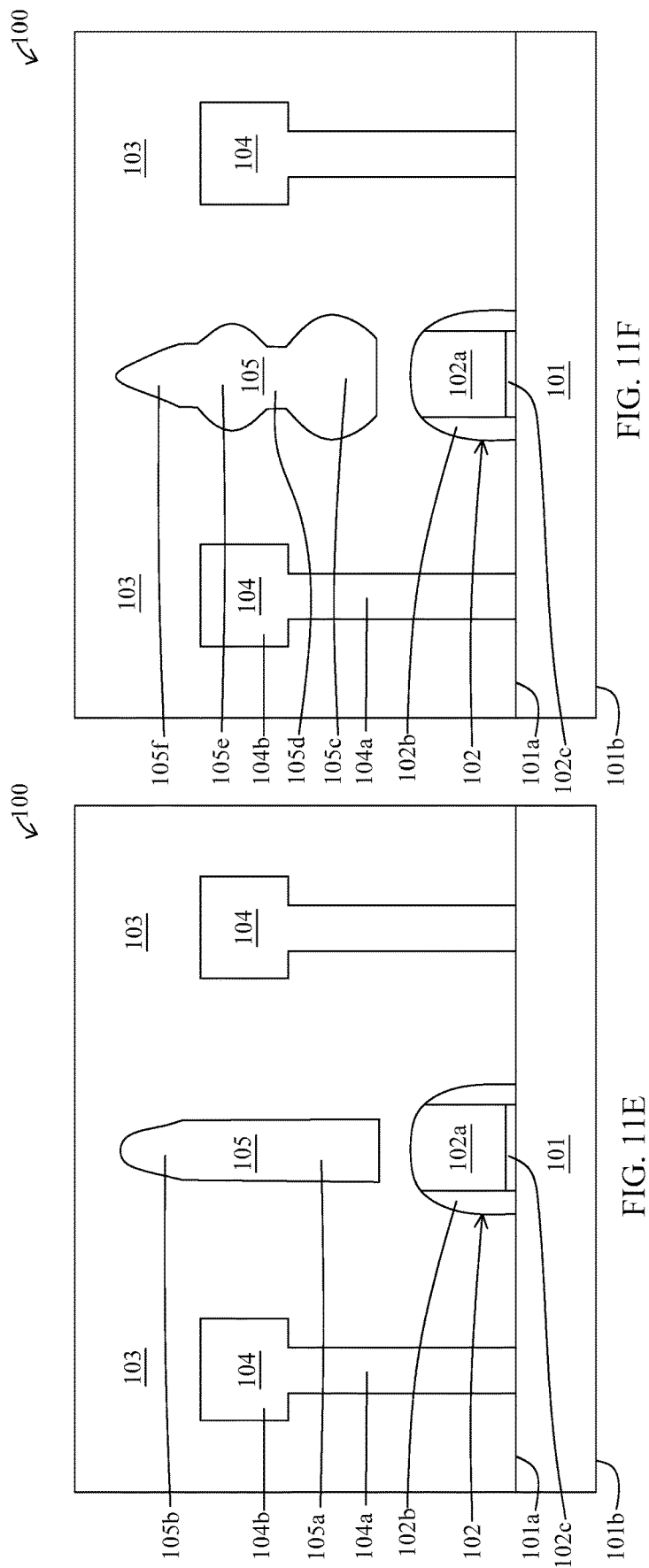

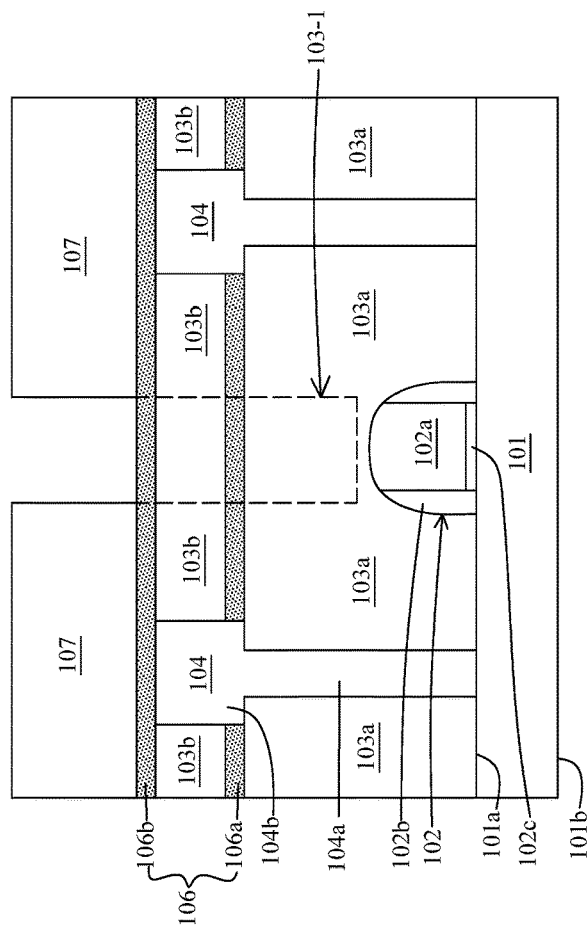
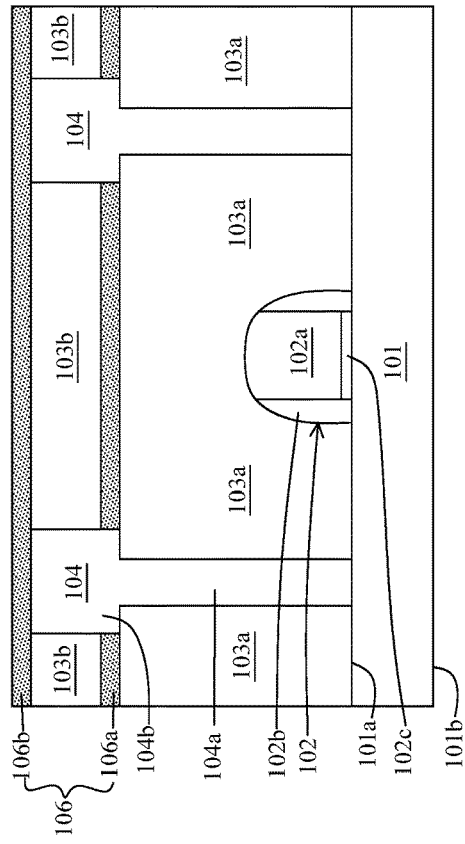
FIG. 12F
FIG. 12E

SEMICONDUCTOR STRUCTURE AND MANUFACTURING METHOD THEREOF

REFERENCE TO RELATED APPLICATIONS

This Application is a Continuation of U.S. application Ser. No. 16/203,853, filed on Nov. 29, 2018, which is a Continuation of U.S. application Ser. No. 15/168,822, filed on May 31, 2016 (now U.S. Pat. No. 10,157,778, issued on Dec. 18, 2018). The contents of the above-referenced Patent Applications are hereby incorporated by reference in their entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Fabrication of semiconductor devices typically involves placing numerous components over a semiconductor substrate. Dielectric materials or isolation structures are used to electrically isolate the components from each other. The components are then interconnected by forming conductive lines over the semiconductor substrate.

Due to the miniaturized scale of the semiconductor device, the components density over the semiconductor substrate continues to increase, while a distance between the components continues to decrease. Numerous manufacturing operations are implemented within such a small semiconductor device, and isolation of the components becomes challenging. An increase in a complexity of manufacturing the semiconductor device may cause deficiencies such as poor electrical isolation, development of cracks or high yield loss of the semiconductor device. Since more different components with different materials are involved, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 11A-11F are schematic views of manufacturing a semiconductor structure by a method of FIG. 11 in accordance with some embodiments of the present disclosure.

FIGS. 12A-12L are schematic views of manufacturing a semiconductor structure by a method of FIG. 12 in accordance with some embodiments of the present disclosure.

DETAILED DESCRIPTION OF THE DISCLOSURE

Figure 1:
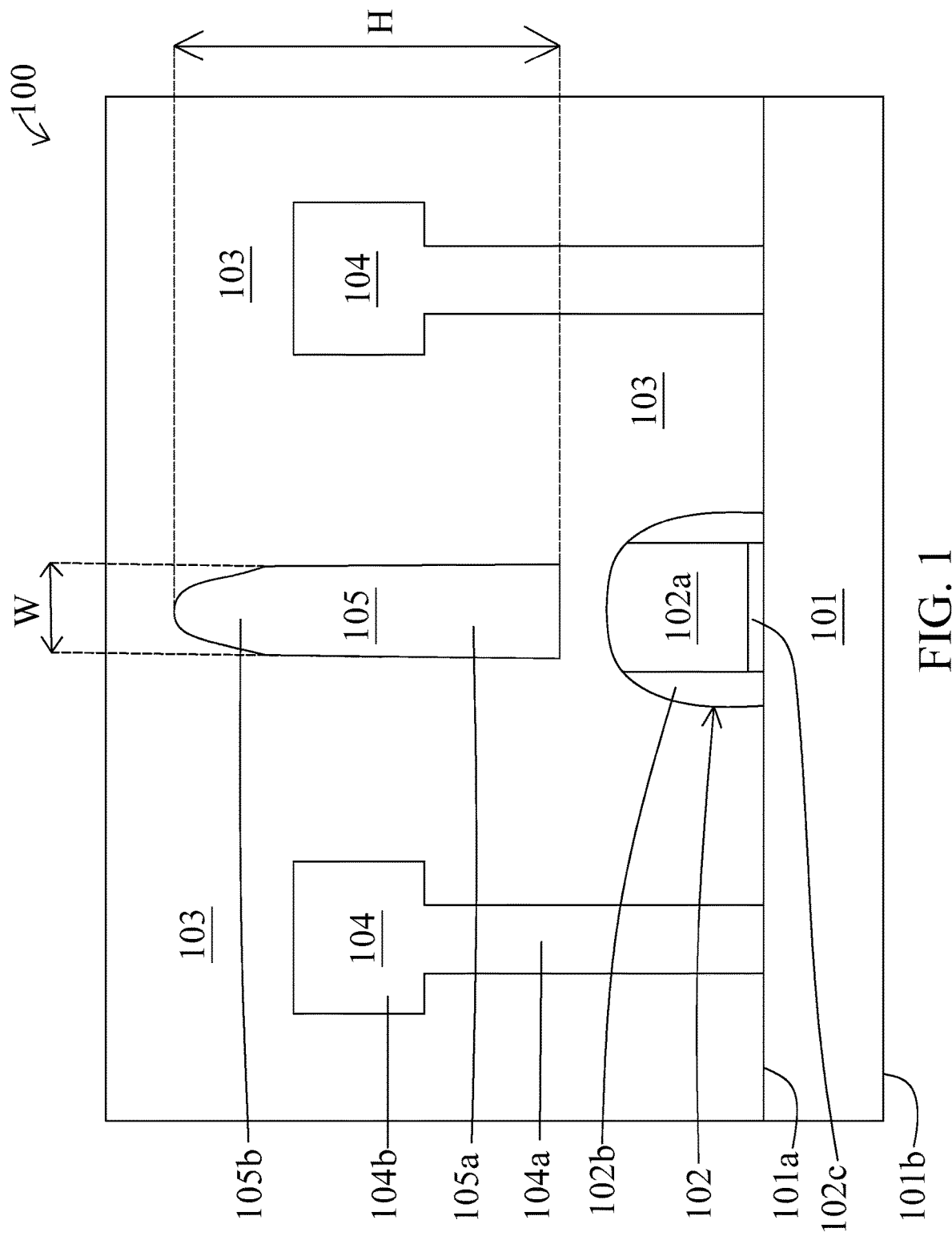
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dielectric material is employed in a semiconductor structure to electrically isolate semiconductor components from each other. The semiconductor components are formed within and separated by the dielectric material. As the size of the semiconductor structure becomes smaller and smaller, the components are getting closer to each other. As such, an undesirable parasitic capacitance would be induced between components. The parasitic capacitance can be minimized by forming an air gap within the dielectric material to isolate components. Since air has a low dielectric constant compared with the dielectric materials such as silicon dioxide, the parasitic capacitance between components can be reduced. Thus, signal leakage or crosstalk between components would also be reduced, and sensitivity of the semiconductor structure would be improved.

In the present disclosure, a semiconductor structure is disclosed. The semiconductor structure includes a substrate, a gate structure disposed over the substrate, a dielectric material disposed over the gate structure and the substrate, a conductive structure disposed within the dielectric material, and a void disposed over the gate structure and extending within the dielectric material. The void is filled with air or is in vacuum. Since the void includes a low dielectric constant, isolation of the conductive structure is improved and parasitic capacitance is reduced. Further, the void is formed by removing a portion of the dielectric material. A volume of the void can be enlarged by removing additional portion of the dielectric material. For example, a portion of the dielectric material is removed by dry etching operations to form a recess, and then an additional portion of the dielectric material is laterally removed by wet etching operations or isotropic etching operations in order to enlarge a volume of the recess. The enlarged recess is then sealed by the dielectric material to form a void. Such enlarged void can further reduce parasitic capacitance. Thus, performance of the semiconductor structure is improved.

FIG. 1 is a schematic cross sectional view of a semiconductor structure 100 in accordance with some embodiments of the present disclosure. In some embodiments, the semiconductor structure 100 includes a substrate 101, a gate structure 102, a dielectric material 103, a conductive structure 104 and a void 105. In some embodiments, the semiconductor structure 100 is a part of a semiconductor device. In some embodiments, the semiconductor structure 100 is a part of a switch circuit or a switching device.

In some embodiments, the substrate 101 includes semiconductive material such as silicon, germanium, gallium arsenide or etc. In some embodiments, the substrate 101 is a silicon substrate, a silicon wafer, a glass substrate or a semiconductor on insulator (SOI) substrate. In some embodiments, the substrate 101 is a single crystalline or polycrystalline silicon substrate. In some embodiments, the substrate 101 includes several electrical components or circuitries.

In some embodiments, the substrate 101 includes a first surface 101a and a second surface 101b opposite to the first surface 101a. In some embodiments, the first surface 101a is at a front side of the substrate 101, and the second surface 101b is at a back side of the substrate 101. In some embodiments, several circuitries or components are formed over the first surface 101a. In some embodiments, the first surface 101a includes an active region where components are formed thereover.

In some embodiments, the substrate 101 is doped with a p-type dopant such as boron or an n-type dopant such as phosphorous to include a source region and a drain region. In some embodiments, the source region and the drain region are electrically isolated by a shallow trench isolation (STI). In some embodiments, the STI is surrounded by or at least partially disposed within the substrate 101. In some embodiments, the STI is configured to electrically isolate components disposed within or over the substrate 101 from each other. In some embodiments, the STI includes a dielectric material such as oxide, silicon oxide, etc.

In some embodiments, the gate structure 102 is disposed over the substrate 101. In some embodiments, the gate structure 102 is a part of a transistor. In some embodiments, the gate structure 102 is disposed over the first surface 101a of the substrate 101. In some embodiments, the gate structure 102 is electrically isolated by the STI. In some embodiments, a current can be flowed from the source region to the drain region across the gate structure 102. In some embodiments, the gate structure 102 includes a gate electrode 102a, a spacer 102b and a gate dielectric layer 102c. In some embodiments, the gate electrode 102a includes a conductive material such as polycrystalline silicon (polysilicon), aluminum, copper, titanium, tungsten, etc. In some embodiments, the spacer 102b includes a dielectric material, such as silicon oxide, silicon oxynitride, silicon nitride, etc. In some embodiments, the gate dielectric layer 102c includes a dielectric material, such as silicon oxide, silicon oxynitride, silicon nitride, etc.

In some embodiments, the dielectric material 103 is disposed over the substrate 101 and the gate structure 102. In some embodiments, the dielectric material 103 is disposed over the first surface 101a of the substrate 101 and covers the gate structure 102. In some embodiments, the dielectric material 103 includes silicon oxide, silicon oxynitride, silicon nitride, etc. In some embodiments, the dielectric material 103 includes several dielectric layers stacking over each other. In some embodiments, the dielectric material 103 includes interlayer dielectric (ILD) or intermetallic dielectric (IMD).

In some embodiments, the conductive structure 104 is disposed and extended within the dielectric material 103. In some embodiments, the conductive structure 104 is elongated within the dielectric material 103 and electrically connected with the substrate 101 or the gate structure 102. In some embodiments, the conductive structure 104 is extended and passes through several layers of the dielectric material 103. In some embodiments, the conductive structure 104 is an electrical contact for electrically connecting with a circuitry or component over or in the substrate 101. In some embodiments, the conductive structure 104 includes a plug portion 104a and a top metal portion 104b. In some embodiments, the conductive structure 104 includes conductive material such as copper, silver, aluminum, titanium, tungsten, etc.

In some embodiments, the void 105 is disposed within the dielectric material 103 and disposed over the gate structure 102. However, the void 105 is separated from the gate structure 102 by a portion of the dielectric material 103. In some embodiments, a portion of the dielectric material 103 is disposed between the void 105 and the gate structure 102. In some embodiments, the void 105 is disposed above the gate structure 102 and extended within the dielectric material 103 along a direction of the thickness of gate structure 102. In some embodiments, the void 105 is aligned with the gate structure 102. In some embodiments, the void 105 is vertically aligned with the gate structure 102. The term "vertically aligned" here means that the elongation direction of the void 105 virtually passes through the gate structure 102. In some embodiments, the void 105 is elongated and passes through several layers of the dielectric material 103. In some embodiments, the conductive structure 104 is neighbored with the gate structure 102 and the void 105.

In some embodiments, the void 105 is enclosed and sealed by the dielectric material 103. In some embodiments, the void 105 is a hallow space of the dielectric material 103. In some embodiments, the void 105 is in vacuum (for example, under 1 mtorr). In some embodiments, the void 105 is filled with air or gas such as noble gas. In some embodiments, the void 105 includes a material with a dielectric constant (k) of about 1. In some embodiments, the void 105 is configured within the dielectric material 103 in order to reduce or minimize parasitic capacitance in the semiconductor structure 100.

In some embodiments, the void 105 includes a width W and a height H. In some embodiments, the void 105 has a high aspect ratio. In some embodiments, a ratio of the width W to the height H of the void 105 is substantially greater than 1:2. In some embodiments, the ratio is about 1:3 to about 1:10. In some embodiments, the height H of the void 105 is about 400 nm to about 1200 nm. In some embodiments, the width W of the void 105 is about 100 nm to about 500 nm. In some embodiments, the width W of the void 105 is about 250 nm to about 450 nm.

In some embodiments, the void 105 includes a body portion 105a elongated within the dielectric material 103, and end portion 105b distal to the gate structure 102, coupled with the body portion 105a and tapered from the body portion 105a and away from the gate structure 102. In some embodiments, the body portion 105a is extended along the height H of the void 105. In some embodiments, the body portion 105a is in cylindrical shape. In some embodiments, the body portion 105a has a consistent width W along the height H. In some embodiments, the body portion 105a includes more than one width along the height H. In some embodiments, the end portion 105b is in a tapered configuration. In some embodiments, the end portion 105b includes more than one width along the height H. In some embodiments, the void 105 is in a candle shape or a tear drop shape. In some embodiments, the body portion 105a and the plug portion 104a are extended in a same direction. In some embodiments, the body portion 105a and the plug portion 104a are vertically extended within the dielectric material 103. In some embodiments, the body portion 105a is extended in a direction parallel to a length of the plug portion 104a. In some embodiments, the plug portion 104a is extended in a direction parallel to a length of the body portion 105a.

Figure 2:
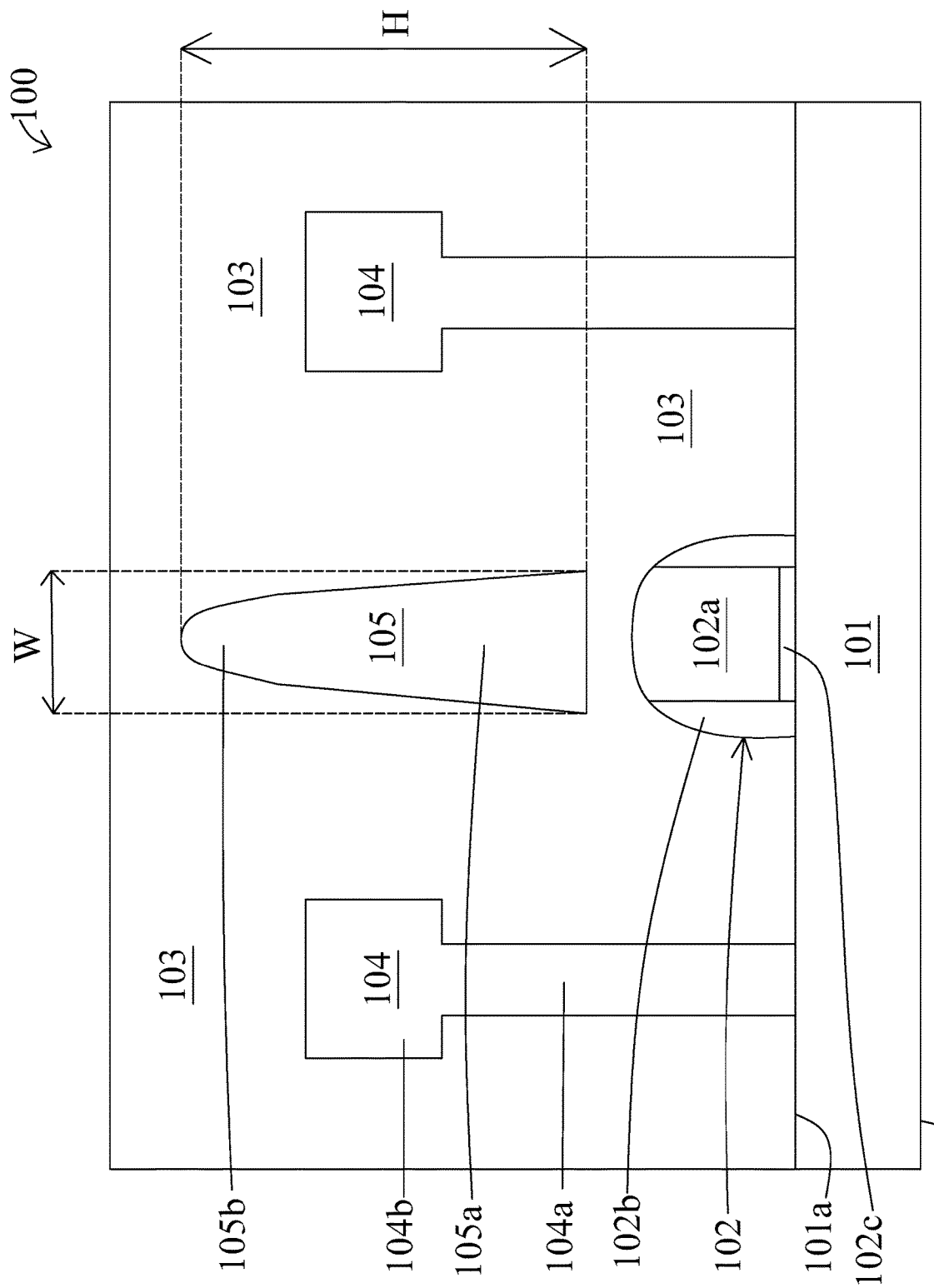
FIGS. 2-5 are schematic cross sectional views of semiconductor structures with a void in various shapes or configurations in accordance with some embodiments of the present disclosure.
Figure 3:
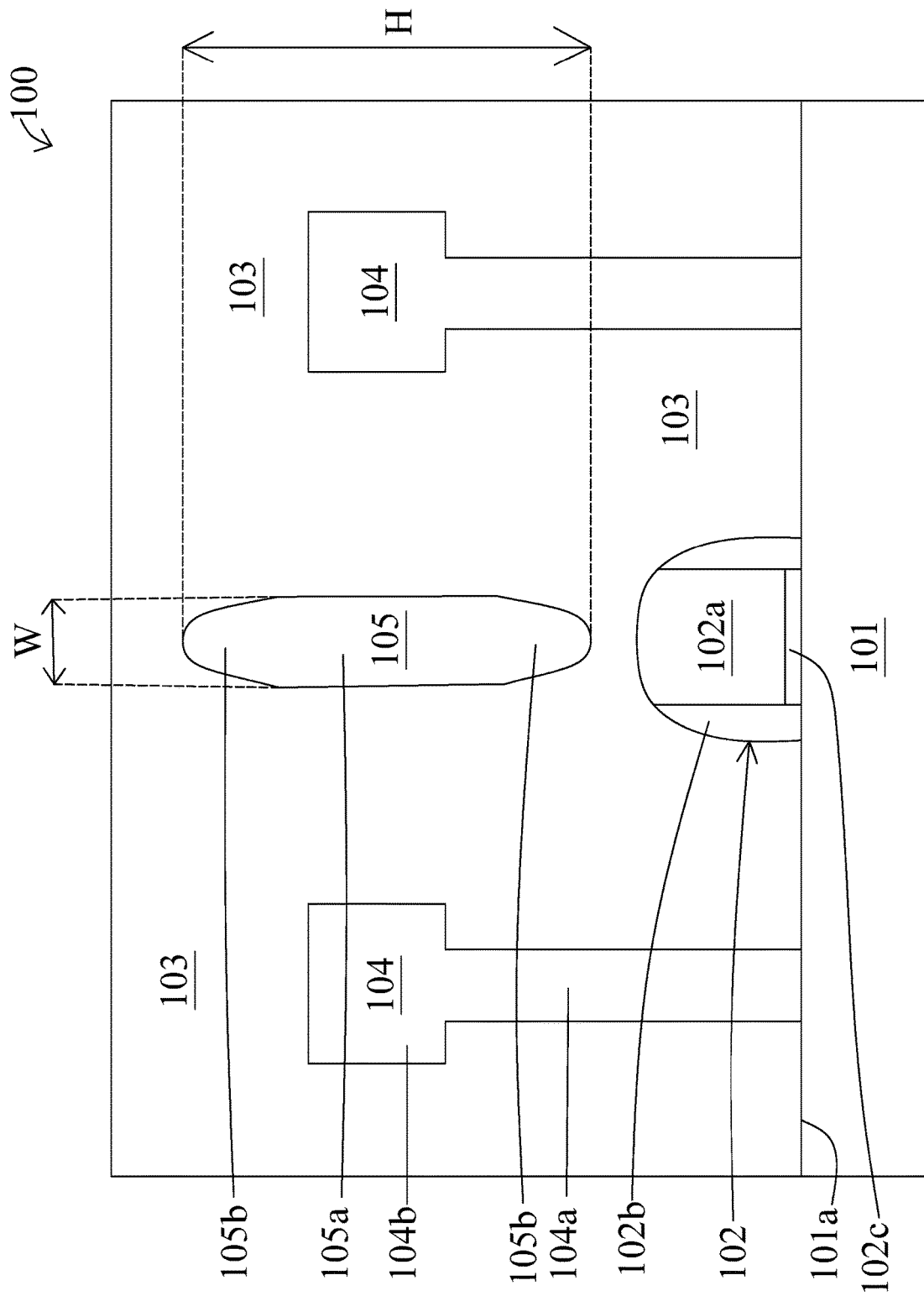

FIGS. 2-5 are schematic cross sectional view of the semiconductor structure 100 including the void 105 in various shapes or configurations. In some embodiments, the substrate 101, the gate structure 102, the dielectric material 103 and the conductive structure 104 have similar configurations as described above or illustrated in FIG. 1. In some embodiments as shown in FIG. 2, the void 105 is tapered along its height H and has more than one width along its height H. In some embodiments, the width W of the void 105 is gradually decreased towards the end portion 105b. In some embodiments as shown in FIG. 3, the void 105 includes two tapered end portions 105b opposite to each other.

Figure 4:
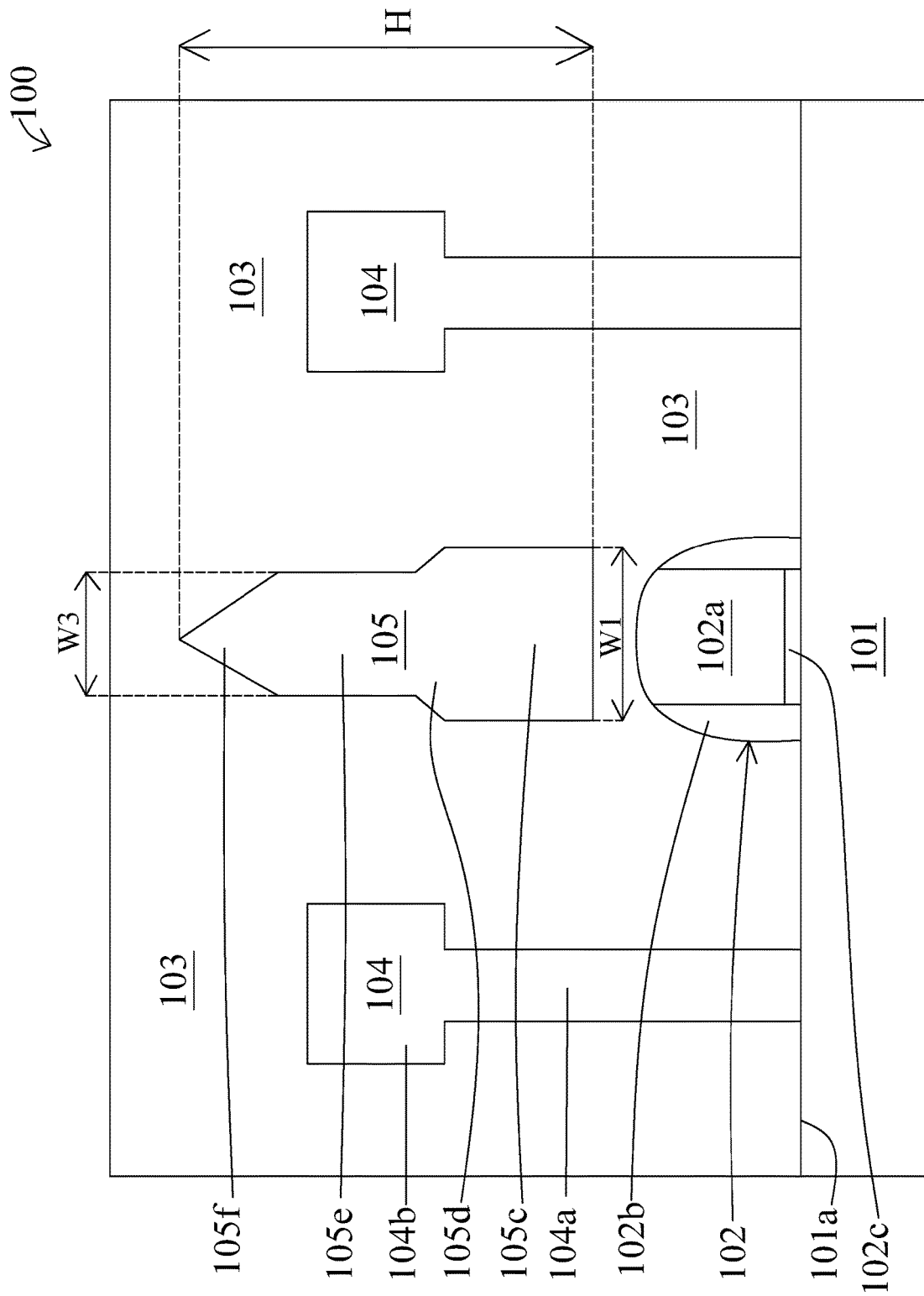
Figure 5:
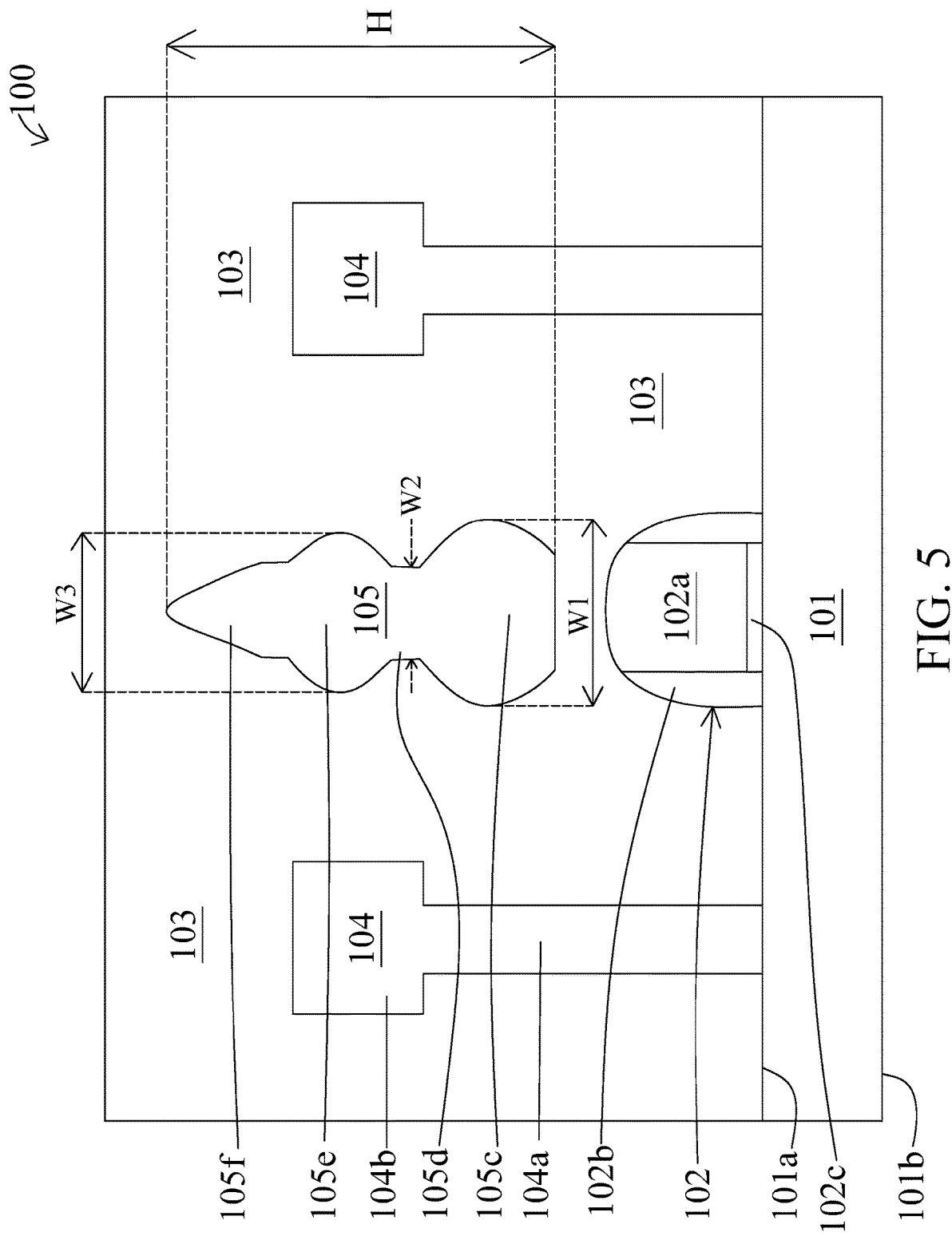

In some embodiments as shown in FIGS. 4 and 5, the void 105 includes a first portion 105c, a second portion 105d, a third portion 105e and an end portion 105f. In some embodiments, the first portion 105c is disposed over the gate structure 102. In some embodiments, the first portion 105c is disposed above or is adjacent to the gate structure 102. In some embodiments, the second portion 105d is disposed over the first portion 105c. In some embodiments, the second portion 105d is coupled with the first portion 105c. In some embodiments, the third portion 105e is disposed over the first portion 105c and the second portion 105d. In some embodiments, the third portion 105e is coupled with the second portion 105d. In some embodiments, the end portion 105f is disposed over and coupled with the third portion 105e. In some embodiments, the end portion 105f is tapered from the third portion 105e and away from the first portion 105c or the second portion 105d. In some embodiments, the second portion 105d is disposed between the first portion 105c and the third portion 105e. In some embodiments, the first portion 105c and the plug portion 104a are extended in a same direction. In some embodiments, the first portion 105c and the plug portion 104a are vertically extended within the dielectric material 103. In some embodiments, the first portion 105c is extended in a direction parallel to a length of the plug portion 104a. In some embodiments, the plug portion 104a is extended in a direction parallel to a length of the first portion 105c.

In some embodiments as shown in FIG. 4, a width W1 of the first portion 105c is substantially greater than or equal to a width W3 of the third portion 105e. In some embodiments, the width W1 or the width W3 is about 200 nm to about 500 nm. In some embodiments, the width W1 or the width W3 is about 250 nm to about 450 nm. In some embodiments, a volume of the first portion 105c is substantially greater than or equal to a volume of the third portion 105e. In some embodiments, a volume of the second portion 105d is substantially less than the volume of the first portion 105c or the volume of the third portion 105e.

In some embodiments as shown in FIG. 5, the width W1 of the first portion 105c is substantially greater than or equal to the width W3 of the third portion 105e. In some embodiments, the width W1 or the width W3 is about 200 nm to about 500 nm. In some embodiments, the width W1 or the width W3 is about 250 nm to about 450 nm. In some embodiments, a width W2 of the second portion 105d is substantially less than the width W1 of the first portion 105c or the width W3 of the third portion 105e. In some embodiments, the width W2 of the second portion 105d is about 80 nm to about 220 nm. In some embodiments, the width W2 of the second portion 105d is about 120 nm to about 200 nm. In some embodiments, a volume of the first portion 105c is substantially greater than or equal to a volume of the third portion 105e. In some embodiments, a volume of the second portion 105d is substantially less than the volume of the first portion 105c or the volume of the third portion 105e.

Figure 6:
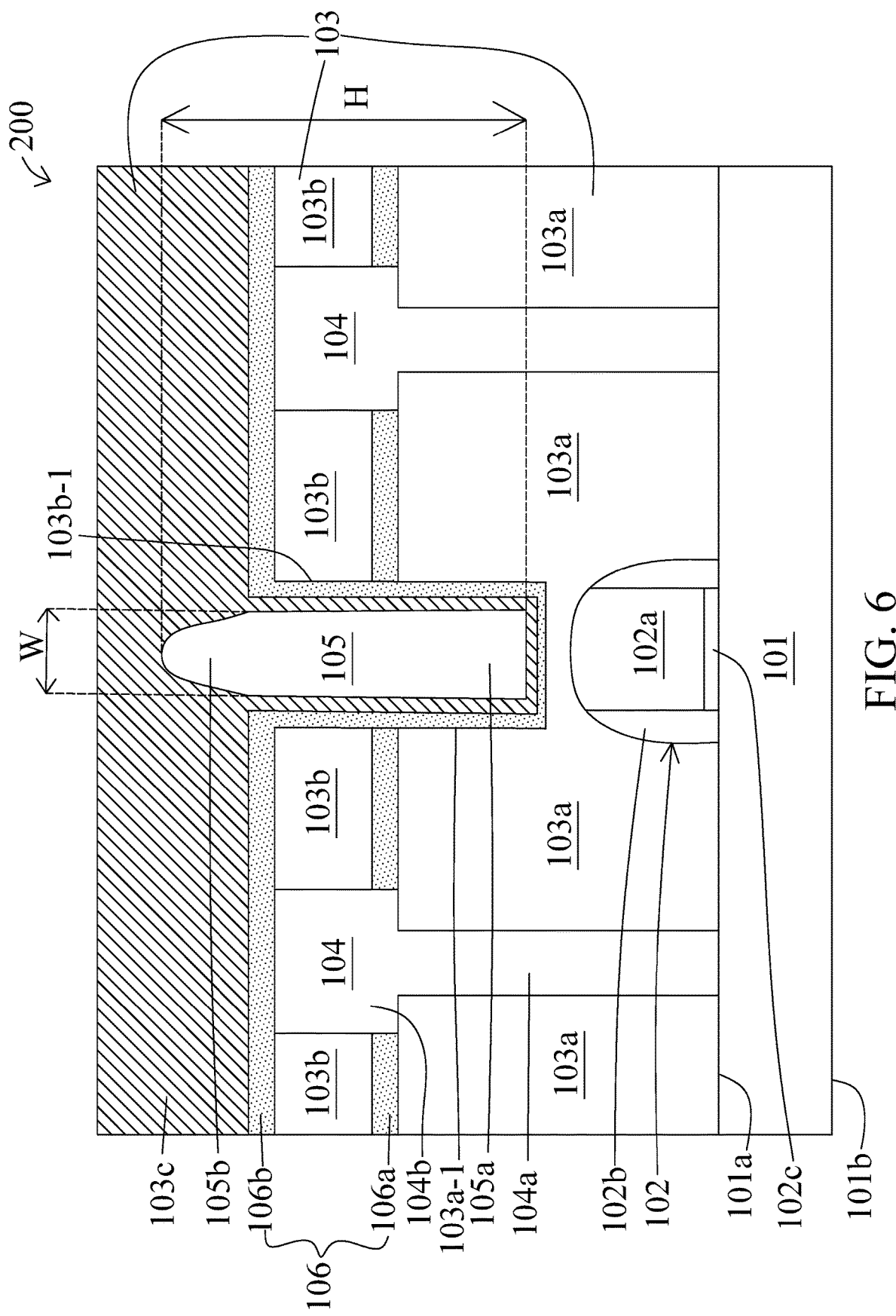
FIG. 6 is a schematic cross sectional view of a semiconductor structure in accordance with some embodiments of the present disclosure.

FIG. 6 is a schematic cross sectional view of a semiconductor structure 200 in accordance with some embodiments of the present disclosure. In some embodiments, the semiconductor structure 200 includes the substrate 101, the gate structure 102, the dielectric material 103, the conductive structure 104 and the void 105 have similar configurations as described above or illustrated in any one of FIGS. 1-5.

In some embodiments, the dielectric material 103 includes a first dielectric layer 103a, a second dielectric layer 103b and a third dielectric layer 103c. In some embodiments, the first dielectric layer 103a is disposed over the substrate 101 and the gate structure 102. In some embodiments, the first dielectric layer 103a is disposed over the first surface 101a of the substrate 101. In some embodiments, the first dielectric layer 103a is an interlayer dielectric (ILD). In some embodiments, the second dielectric layer 103b is disposed over the first dielectric layer 103a and the substrate 101. In some embodiments, the third dielectric layer 103c is disposed over the second dielectric layer 103b, the first dielectric layer 103a and the substrate 101. In some embodiments, the second dielectric layer 103b or the third dielectric layer 103c is an intermetallic dielectric (IMD). In some embodiments, the first dielectric layer 103a, the second dielectric layer 103b and the third dielectric layer 103c include same material as each other or different material from each other. In some embodiments, the first dielectric layer 103a, the second dielectric layer 103b and the third dielectric layer 103c include dielectric material such as silicon oxide, silicon oxynitride, silicon nitride, etc.

In some embodiments, the conductive structure 104 is extended through and within the first dielectric layer 103a and the second dielectric layer 103b. In some embodiments, the conductive structure 104 includes the plug portion 104a surrounded by the first dielectric layer 103a and the top metal portion 104b surrounded by the second dielectric layer 103b. In some embodiments, the plug portion 104a is extended through the first dielectric layer 103a, and the top metal portion 104b is extended through the second dielectric layer 103b.

In some embodiments, the third dielectric layer 103c is disposed over the second dielectric layer 103b and the conductive structure 104. In some embodiments, the third dielectric layer 103c is interfaced with the void 105. In some embodiments, the void 105 is surrounded by the first dielectric layer 103a, the second dielectric layer 103b and the third dielectric layer 103c. In some embodiments, the void 105 is disposed over the gate structure 102 and extending from the first dielectric layer 103a to the third dielectric layer 103c. In some embodiments, the void 105 is sealed and enclosed by the third dielectric layer 103c. In some embodiments, a portion of the third dielectric layer 103c is extended along the height of the void 105 and conformal to the void 105. In some embodiments, the void 105 includes the body portion 105a and the end portion 105b. In some embodiments, the body portion 105a is surrounded by the first dielectric layer 103a and the second dielectric layer 103b. In some embodiments, the end portion 105b is surrounded by the third dielectric layer 103c. In some embodiments, a portion of the first dielectric layer 103a is disposed between the void 105 and the gate structure 102. In some embodiments, a portion of the third dielectric layer 103c is disposed between the void 105 and the gate structure 102. In some embodiments, the body portion 105a and the plug portion 104a are extended in a same direction. In some embodiments, the body portion 105a and the plug portion 104a are vertically extended within the first dielectric layer 103a. In some embodiments, the body portion 105a is extended in a direction parallel to a length of the plug portion 104a. In some embodiments, the plug portion 104a is extended in a direction parallel to a length of the body portion 105a.

In some embodiments, the dielectric material 103 is interposed by a capping layer 106. In some embodiments, the capping layer 106 includes nitride, silicon nitride, etc. In some embodiments, the capping layer 106 includes a first capping layer 106a and a second capping layer 106b. In some embodiments, the first capping layer 106a is disposed between the first dielectric layer 103a and the second dielectric layer 103b. In some embodiments, the first capping layer 106a surrounds a portion of the conductive structure 104 or the top metal portion 104b of the conductive structure 104.

In some embodiments, the second capping layer 106b is disposed between the second dielectric layer 103b and the third dielectric layer 103c, or is disposed between the first dielectric layer 103a and the third dielectric layer 103c. In some embodiments, a portion of the second capping layer 106b is extended along the height of the void 105 or the portion of the third dielectric layer 103c. In some embodiments, the portion of the second capping layer 106b is conformal to a sidewall 103b-1 of the second dielectric layer 103b and a sidewall 103a-1 of the first dielectric layer 103a. In some embodiments, the second capping layer 106b surrounds the void 105 and the third dielectric layer 103c. In some embodiments, a portion of the second capping layer 106b is disposed between the void 105 and the gate 102. In some embodiments, the third dielectric layer 103c is interposed between the second capping layer 106b and the body portion 105a of the void 105. In some embodiments, the first capping layer 106a and the second capping layer 106b include same material as each other or different material from each other.

FIGS. 7-10 are schematic cross sectional view of the semiconductor structure 200 including the void 105 in various shapes or configurations. In some embodiments, the substrate 101, the gate structure 102, the dielectric material 103 (including the first dielectric layer 103a, the second dielectric layer 103b and the third dielectric layer 103c) and the conductive structure 104 have similar configurations as described above or illustrated in FIG. 6. In some embodiments, the semiconductor structures 200 as shown in FIGS. 2-5 have similar configurations as the semiconductor structures 100 as shown in FIG. 7-10 respectively.

Figure 7:
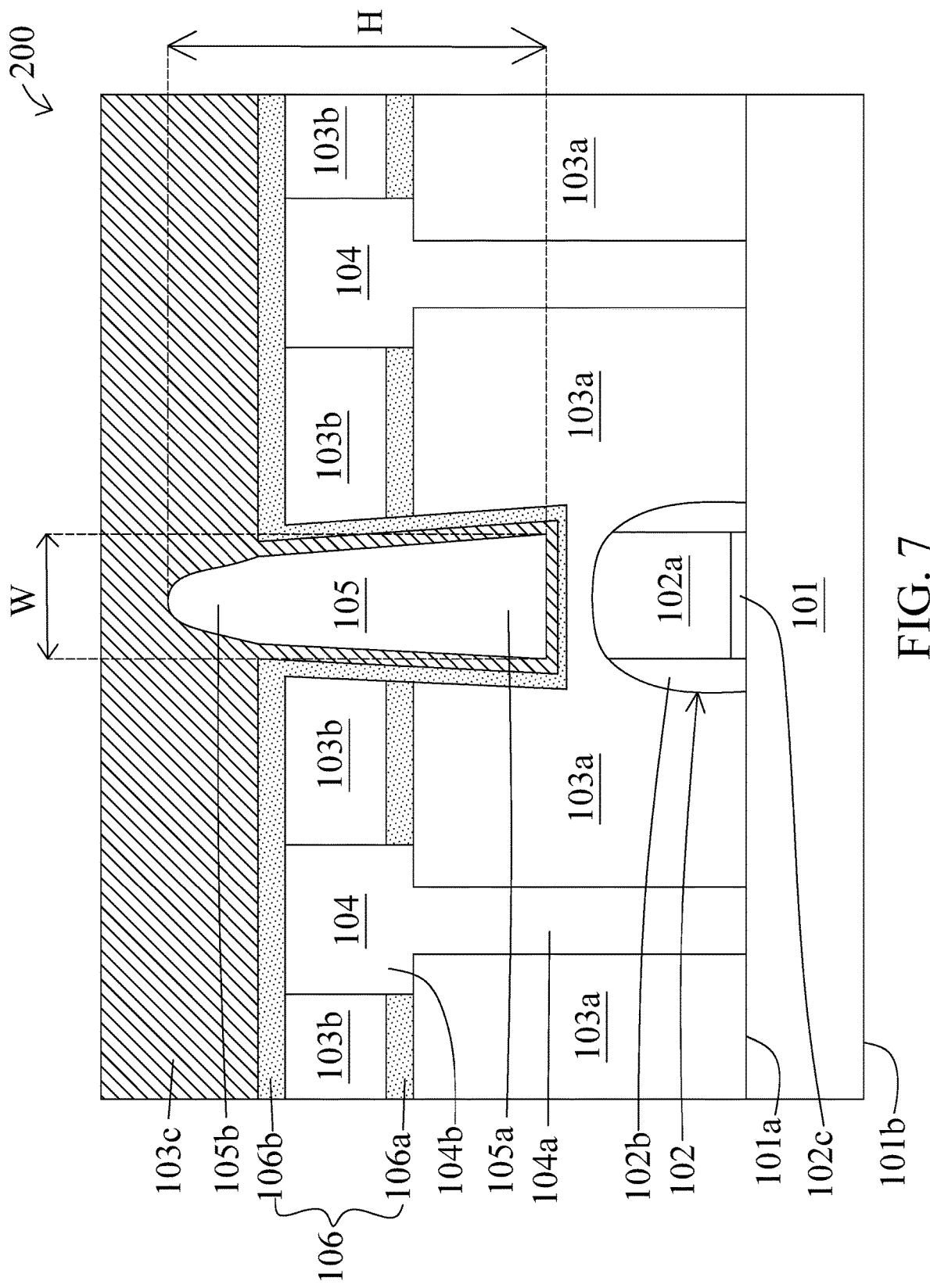
FIGS. 7-10 are schematic cross sectional views of semiconductor structures with a void in various shapes or configurations in accordance with some embodiments of the present disclosure.
Figure 8:
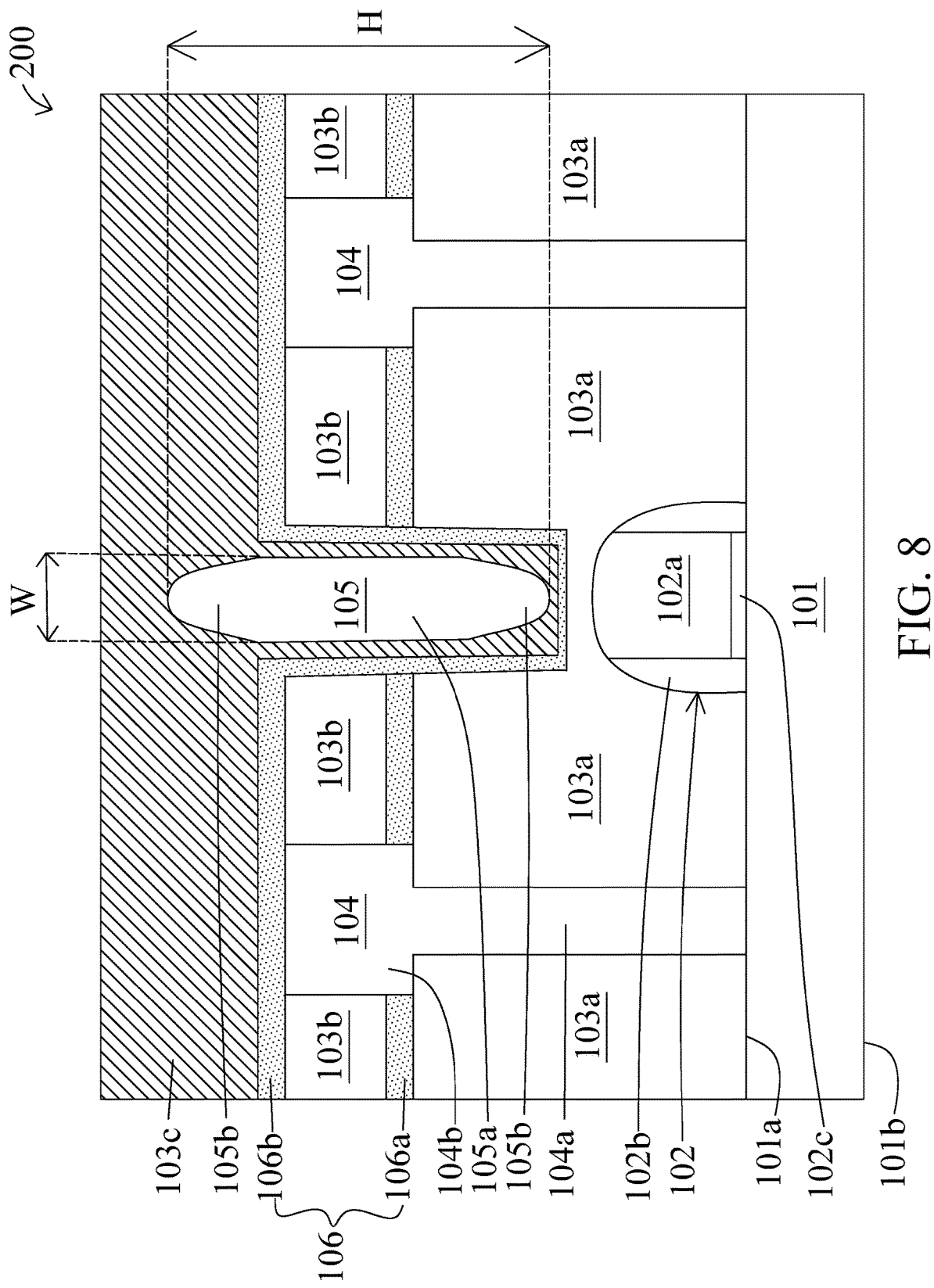

In some embodiments as shown in FIG. 7, the void 105 is tapered along its height H and has more than one width along its height H. In some embodiments, the width W of the void 105 is gradually decreased towards the end portion 105b. In some embodiments as shown in FIG. 8, the void 105 includes two tapered end portions 105b opposite to each other.

Figure 9:
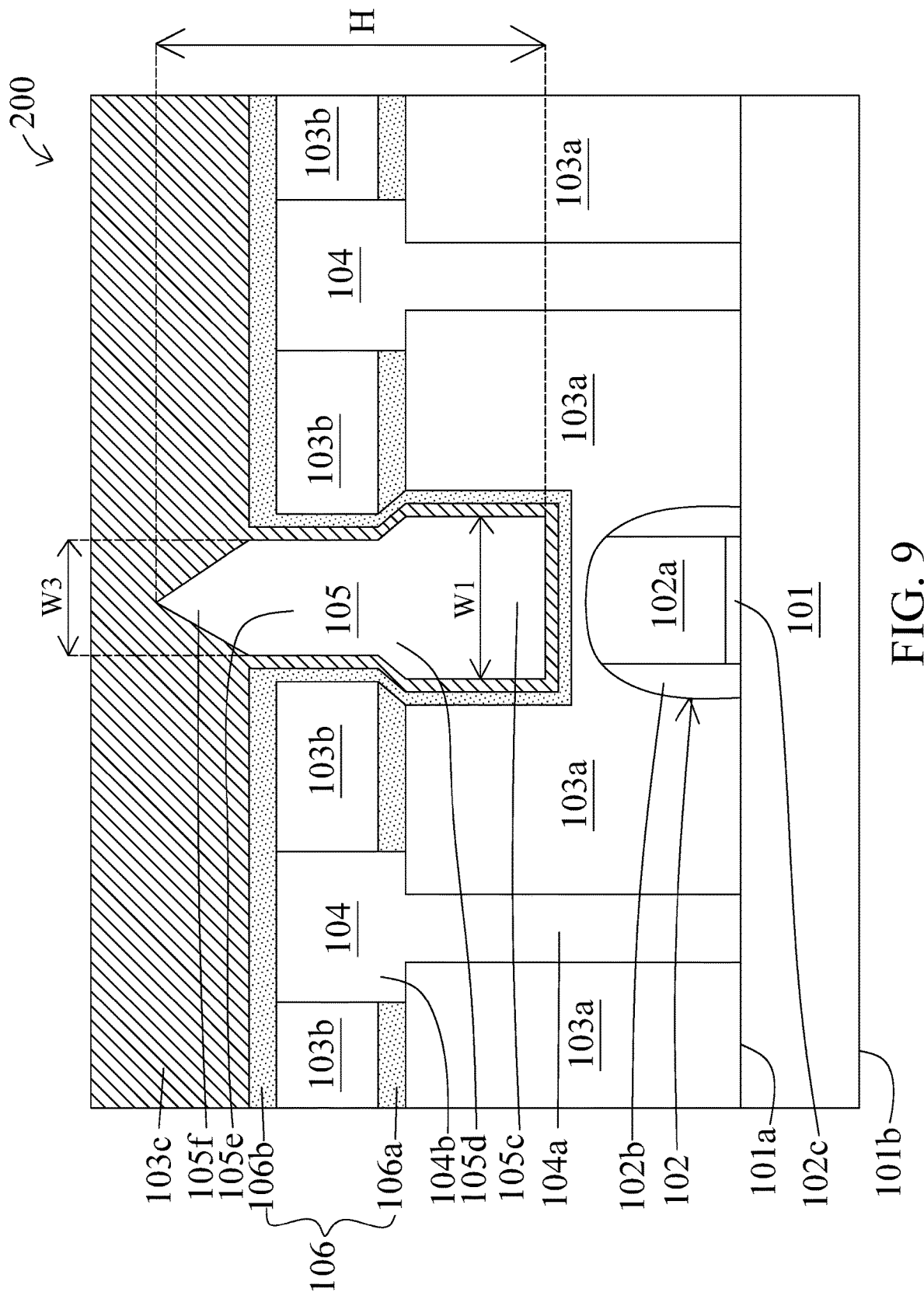
Figure 10:
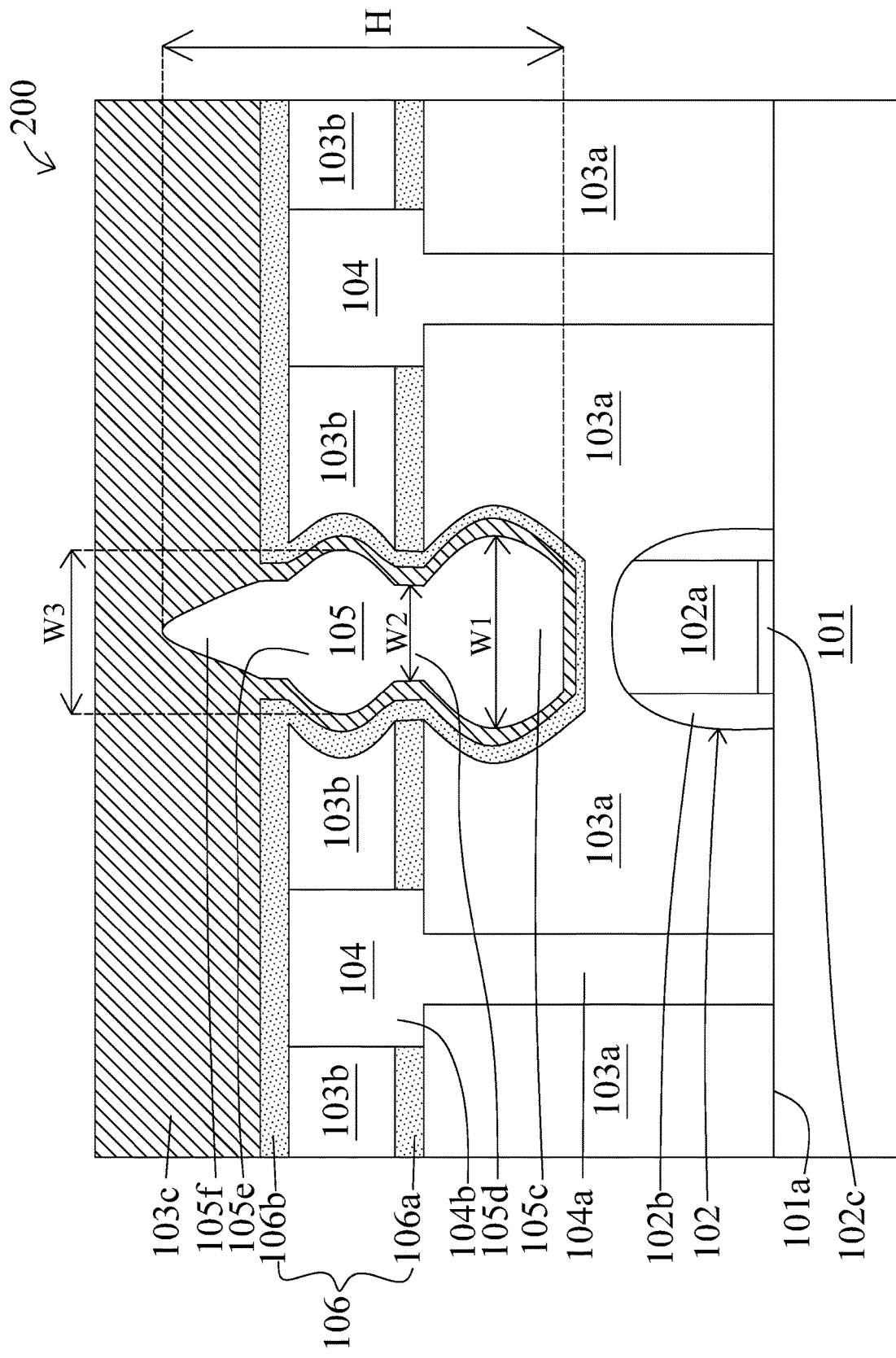

In some embodiments as shown in FIGS. 9 and 10, the void 105 includes a first portion 105c, a second portion 105d, a third portion 105e and an end portion 105f. In some embodiments, the first portion 105c is disposed over the gate structure 102. In some embodiments, the first portion 105c is disposed above or is adjacent to the gate structure 102. In some embodiments, the first portion 105c is surrounded by the first dielectric layer 103a. In some embodiments, the third portion 105e of the void 105 and the top metal portion 104b of the conductive structure 104 are extended through the second dielectric layer 103b. In some embodiments, the first portion 105c is extended from the second portion 105d or the third portion 105e towards the gate structure 102. In some embodiments, the plug portion 104a of the conductive structure 104 is extended through the first dielectric layer 103a and extended to the surface 101a of the substrate 101. In some embodiments, the first portion 105c and the plug portion 104a are extended in a same direction. In some embodiments, the first portion 105c and the plug portion 104a are vertically extended within the first dielectric material 103a. In some embodiments, the first portion 105c is extended in a direction parallel to a length of the plug portion 104a. In some embodiments, the plug portion 104a is extended in a direction parallel to a length of the first portion 105c.

In some embodiments, the second portion 105d is disposed over the first portion 105c. In some embodiments, the second portion 105d is coupled with the first portion 105c. In some embodiments, the second portion 105d is surrounded by the first dielectric layer 103a and the second dielectric layer 103b. In some embodiments, the second portion 105d is surrounded by the first capping layer 106a.

In some embodiments, the third portion 105e is disposed over the first portion 105c and the second portion 105d. In some embodiments, the third portion 105e is coupled with the second portion 105d. In some embodiments, the end portion 105f is disposed over and coupled with the third portion 105e. In some embodiments, the third portion 105e is surrounded by the second dielectric layer 103b.

In some embodiments, the end portion 105f is tapered from the third portion 105e and away from the first portion 105c or the second portion 105d. In some embodiments, the second portion 105d is disposed between the first portion 105c and the third portion 105e. In some embodiments, the end portion 105f is surrounded by the third dielectric layer 103c. In some embodiments, the end portion 105f is tapered from the second dielectric layer 103b towards the third dielectric layer 103c.

In some embodiments as shown in FIG. 9, a width W1 of the first portion 105c is substantially greater than or equal to a width W3 of the third portion 105e. In some embodiments, the width W1 or the width W3 is about 200 nm to about 500 nm. In some embodiments, the width W1 or the width W3 is about 250 nm to about 450 nm. In some embodiments, a volume of the first portion 105c is substantially greater than or equal to a volume of the third portion 105e. In some embodiments, a volume of the second portion 105d is substantially less than the volume of the first portion 105c or the volume of the third portion 105e.

In some embodiments as shown in FIG. 10, the width W1 of the first portion 105c is substantially greater than or equal to the width W3 of the third portion 105e. In some embodiments, the width W1 or the width W3 is about 200 nm to about 500 nm. In some embodiments, the width W1 or the width W3 is about 250 nm to about 450 nm. In some embodiments, a width W2 of the second portion 105d is substantially less than the width W1 of the first portion 105c or the width W3 of the third portion 105e. In some embodiments, the width W2 of the second portion 105d is about 80 nm to about 220 nm. In some embodiments, the width W2 of the second portion 105d is about 120 nm to about 200 nm. In some embodiments, a volume of the first portion 105c is substantially greater than or equal to a volume of the third portion 105e. In some embodiments, a volume of the second portion 105d is substantially less than the volume of the first portion 105c or the volume of the third portion 105e.

Figure 11:
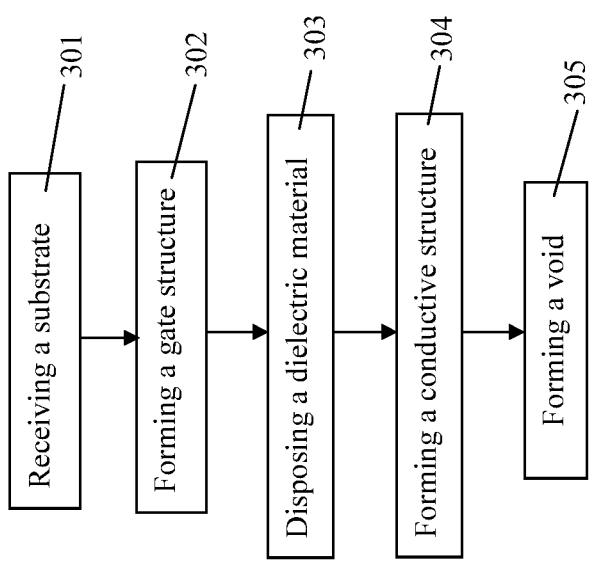
FIG. 11 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method. The method includes a number of operations and the description and illustration are not deemed as a limitation as the sequence of the operations. FIG. 11 is an embodiment of a method 300 of manufacturing a semiconductor structure 100. The method 300 includes a number of operations (301, 302, 303, 304 and 305).

In operation 301, a substrate 101 is received or provided as shown in FIG. 11A. In some embodiments, the substrate 101 is a silicon substrate, a silicon wafer, a glass substrate or a semiconductor on insulator (SOI) substrate, a single crystalline silicon substrate or a polycrystalline silicon substrate. In some embodiments, the substrate 101 includes several electrical components or circuitries. In some embodiments, the substrate 101 has similar configuration as described above or illustrated in any one of FIGS. 1-10.

In operation 302, a gate structure 102 is formed over the substrate 101 as shown in FIG. 11B. In some embodiments, the gate structure 102 is formed over a first surface 101a of the substrate 101. In some embodiments, the gate structure 102 is formed by gate first operations, gate last operations, replacement gate operations or any other suitable operations. In some embodiments, the gate structure 102 has similar configuration as described above or illustrated in any one of FIGS. 1-10.

In operation 303, a dielectric material 103 is disposed over the substrate 101 and the gate structure 102 as shown in FIG. 11C. In some embodiments, the dielectric material 103 is disposed over the first surface 101a of the substrate 101 and covers the gate structure 102. In some embodiments, the dielectric material 103 is disposed by deposition operations, spinning operations, chemical vapor deposition (CVD) operations, plasma-enhanced CVD (PECVD) operations or any other suitable operations. In some embodiments, the dielectric material 103 has similar configuration as described above or illustrated in any one of FIGS. 1-10.

In operation 304, a conductive structure 104 is formed as shown in FIG. 11D. In some embodiments, the conductive structure 104 is extended within the dielectric material 103. In some embodiments, the conductive structure 104 is electrically connected with the substrate 101 or the gate structure 102. In some embodiments, some portions of dielectric material 103 are removed by any suitable operations such as photolithography and etching or etc. to form a cavity, and then conductive material such as copper, silver, aluminum, etc. fills the cavity by any suitable operations such as sputtering, electroplating or etc. to form the conductive structure 104. In some embodiments, the conductive structure 104 has similar configuration as described above or illustrated in any one of FIGS. 1-10.

In operation 305, a void 105 is formed as shown in FIG. 11E or 11F. In some embodiments, the void 105 is disposed over the gate structure 102 and extended within the dielectric material 103. In some embodiments, the void 105 is formed above the gate structure 102. In some embodiments, some portions of the dielectric material 103 are removed by any suitable operations such as lithography and etching, dry etching, wet etching, isotropic etching or etc. to form a recess, and then sealing or enclosing the recess by further disposing the dielectric material 103 over the recess to form the void 105. In some embodiments, the void 105 is in vacuum or filled with air, gas or a material with dielectric constant of about 1. In some embodiments, the void 105 has similar configuration as described above or illustrated in any one of FIGS. 1-10.

In some embodiments as shown in FIG. 11E, a body portion 105a of the void 105 is formed by removing some portions of the dielectric material 103. In some embodiments, some portions of the dielectric material 103 are orthogonally removed by dry etching or any other suitable operations to form the body portion 105a of the void 105. In some embodiments, a tapered end portion 105b of the void 105 is formed upon further disposing the dielectric material 103 over the recess.

In some embodiments as shown in FIG. 11F, the recess is enlarged by laterally removing additional portions of the dielectric material 103, such that the void 105 with larger volume (for example, compared with the void 105 in FIG. 11E) is formed. In some embodiments, additional portions of the dielectric material 103 are removed by any suitable operations such as wet etching, isotropic etching, etc. In some embodiments, the void 105 having a first portion 105c, a second portion 105d and a third portion 105e is formed when the additional portions of the dielectric material 103 are removed. In some embodiments, additional portions of the dielectric material 103 are selectively removed (since different portions of the dielectric material 103 have different etching rates or different etching selectivities with respect to a predetermined etchant), such that a volume of the first portion 105c and a volume of the third portion 105e are substantially greater than a volume of the second portion 105d. In some embodiments, a tapered end portion 105f of the void 105 is formed upon further disposing the dielectric material 103 over the enlarged recess.

Figure 12:
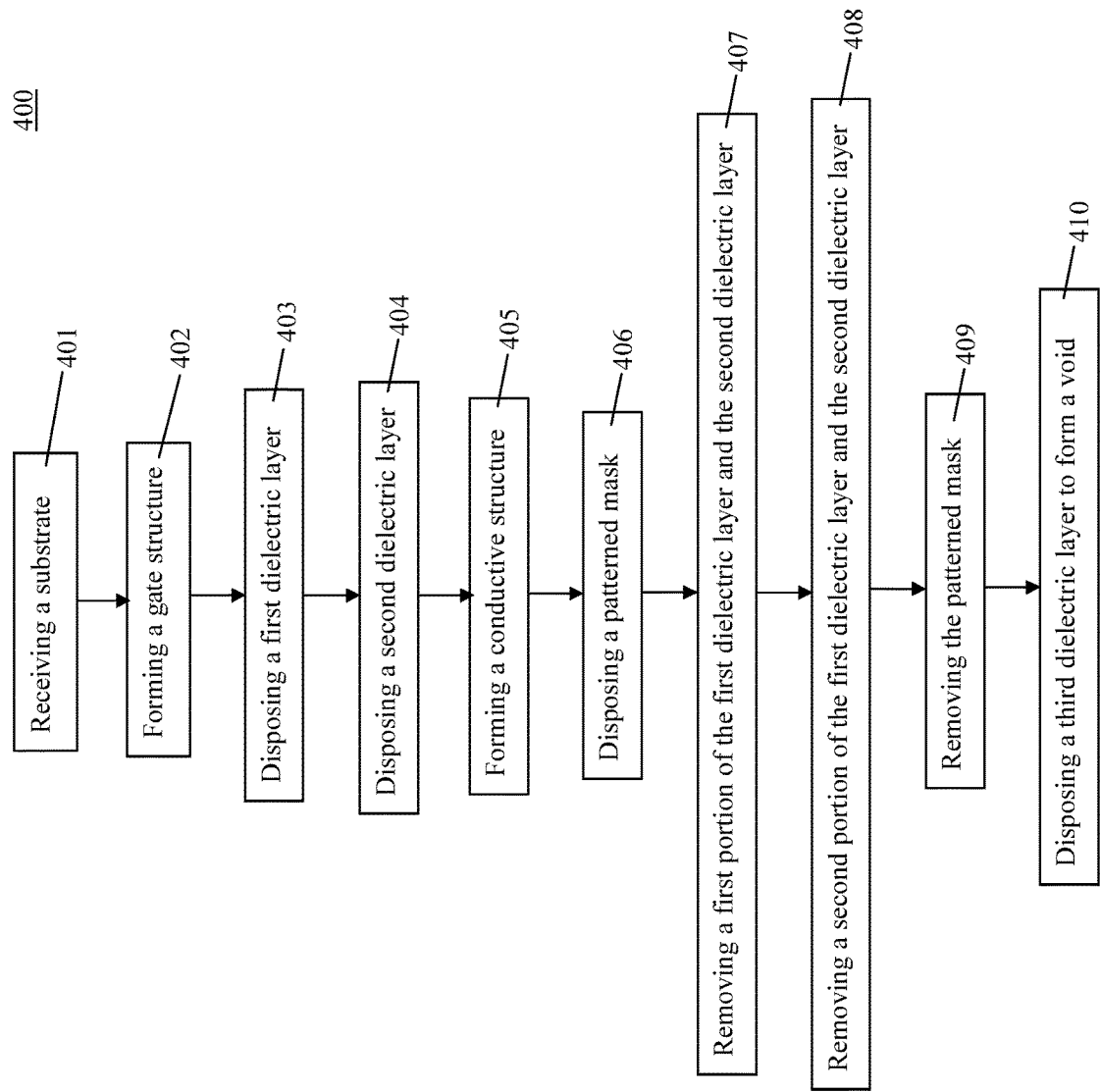
FIG. 12 is a flow diagram of a method of manufacturing a semiconductor structure in accordance with some embodiments of the present disclosure.

FIG. 12 is an embodiment of a method 400 of manufacturing a semiconductor structure 200. The method 400 includes a number of operations (401, 402, 403, 404, 405, 406, 407, 408, 409 and 410).

Figure 12A:
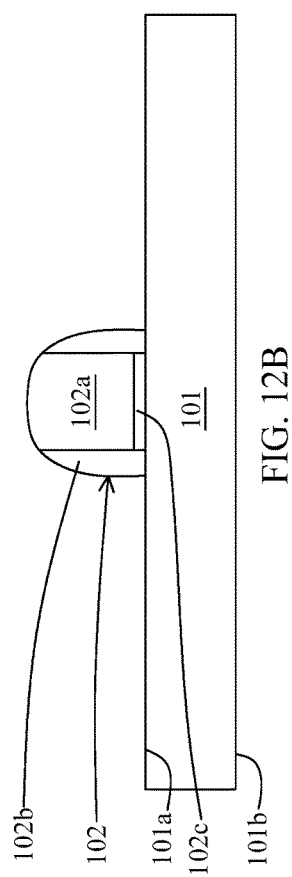
Figure 12B:
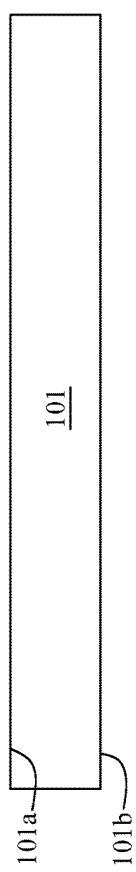

In operation 401, a substrate 101 is received or provided as shown in FIG. 12A. In some embodiments, the operation 401 is similar to the operation 301. In operation 402, a gate structure 102 is formed as shown in FIG. 12B. In some embodiments, the operation 402 is similar to the operation 302.

Figure 12C:
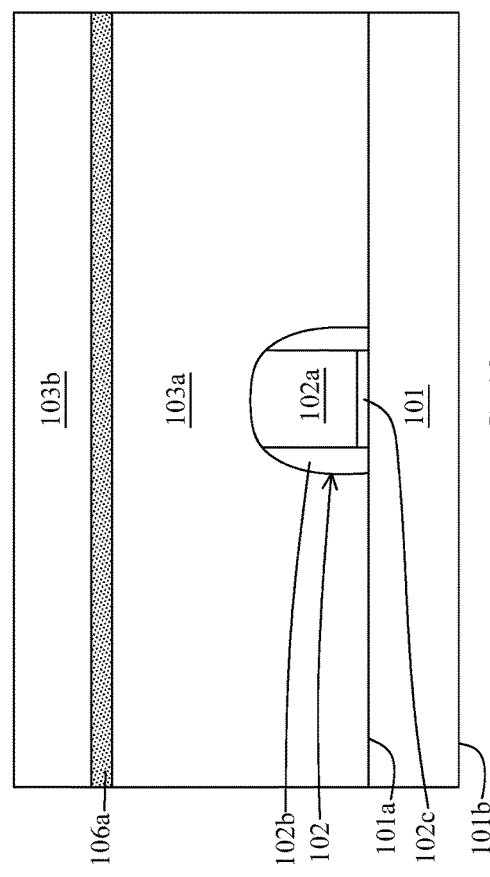

In operation 403, a first dielectric layer 103a is disposed over the substrate 101 and the gate structure 102 as shown in FIG. 12C. In some embodiments, the first dielectric layer 103a is disposed over the first surface 101a of the substrate 101 and covers the gate structure 102. In some embodiments, the first dielectric layer 103a is disposed by deposition operations, spinning operations, CVD operations, PECVD operations or any other suitable operations. In some embodiments, the first dielectric layer 103a is an ILD. In some embodiments, the first dielectric layer 103a has similar configuration as described above or illustrated in any one of FIGS. 6-10.

In some embodiments, a first capping layer 106a is disposed over the first dielectric layer 103a. In some embodiments, the first capping layer 106a includes nitride. In some embodiments, the first capping layer 106a has an etching rate different from an etching rate of the first dielectric layer 103a with respect to a predetermined etchant. In some embodiments, the first capping layer 106a is disposed by deposition operations, spinning operations, CVD operations, PECVD operations or any other suitable operations. In some embodiments, the first capping layer 106a has similar configuration as described above or illustrated in any one of FIGS. 6-10.

Figure 12D:
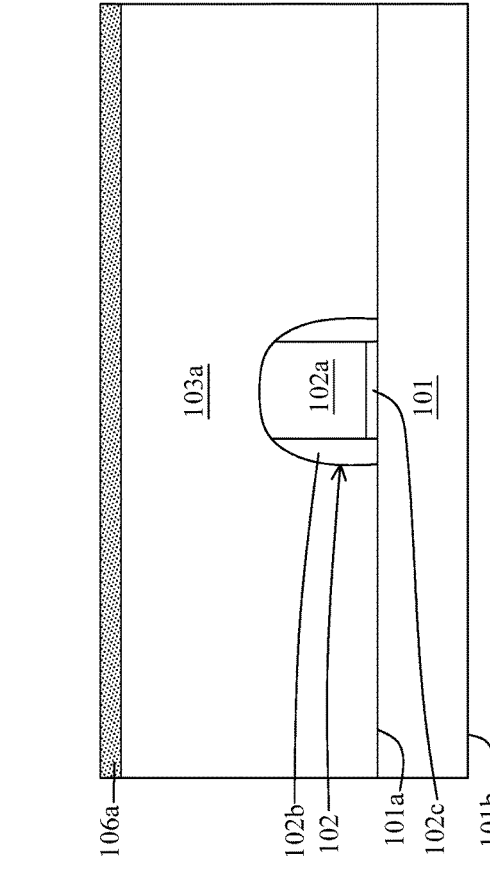

In operation 404, a second dielectric layer 103b is disposed over the first dielectric layer 103a as shown in FIG. 12D. In some embodiments, the second dielectric layer 103b is disposed by deposition operations, spinning operations, CVD operations, PECVD operations or any other suitable operations. In some embodiments, the second dielectric layer 103b is an IMD. In some embodiments, the second dielectric layer 103b has similar configuration as described above or illustrated in any one of FIGS. 6-10.

In operation 405, a conductive structure 104 is formed as shown in FIG. 12E. In some embodiments, the conductive structure 104 is extended through the first dielectric layer 103a and the second dielectric layer 103b. In some embodiments, a portion of the first dielectric layer 103a is removed by any suitable operations such as photolithography and etching or etc. to form a first cavity, and then a conductive material fills the first cavity by any suitable operations such as sputtering, electroplating or etc. to form a plug portion 104a of the conductive structure 104. In some embodiments, a portion of the second dielectric layer 103b is removed by any suitable operations such as photolithography and etching or etc. to form a second cavity, and then a conductive material fills the second cavity by any suitable operations such as sputtering, electroplating or etc. to form a top metal portion 104b of the conductive structure 104. In some embodiments, the conductive structure 104 has similar configuration as described above or illustrated in any one of FIGS. 1-10.

In some embodiments, a second capping layer 106b is disposed over the second dielectric layer 103b and the conductive structure 104. In some embodiments, the second capping layer 106b includes nitride. In some embodiments, the second capping layer 106b includes same material or different material from the first capping layer 106a. In some embodiments, the second capping layer 106b has an etching rate different from an etching rate of the first capping layer 106a with respect to a predetermined etchant. In some embodiments, the second capping layer 106b is disposed by deposition operations, spinning operations, CVD operations, PECVD operations or any other suitable operations. In some embodiments, the second capping layer 106b has similar configuration as described above or illustrated in any one of FIGS. 6-10.

In operation 406, a patterned mask 107 is disposed over the second dielectric layer 103b as shown in FIG. 12F. In some embodiments, the patterned mask 107 is formed by disposing a photoresist over the second dielectric layer 103b and patterning the photoresist. In some embodiments, the photoresist is patterned by removing a portion of the photoresist to form the patterned mask 107. In some embodiments, a first portion 103-1 of the first dielectric layer 103a, the first capping layer 106a, the second dielectric layer 103b and the second capping layer 106b is exposed from the patterned mask 107.

Figures 12G, 12H:
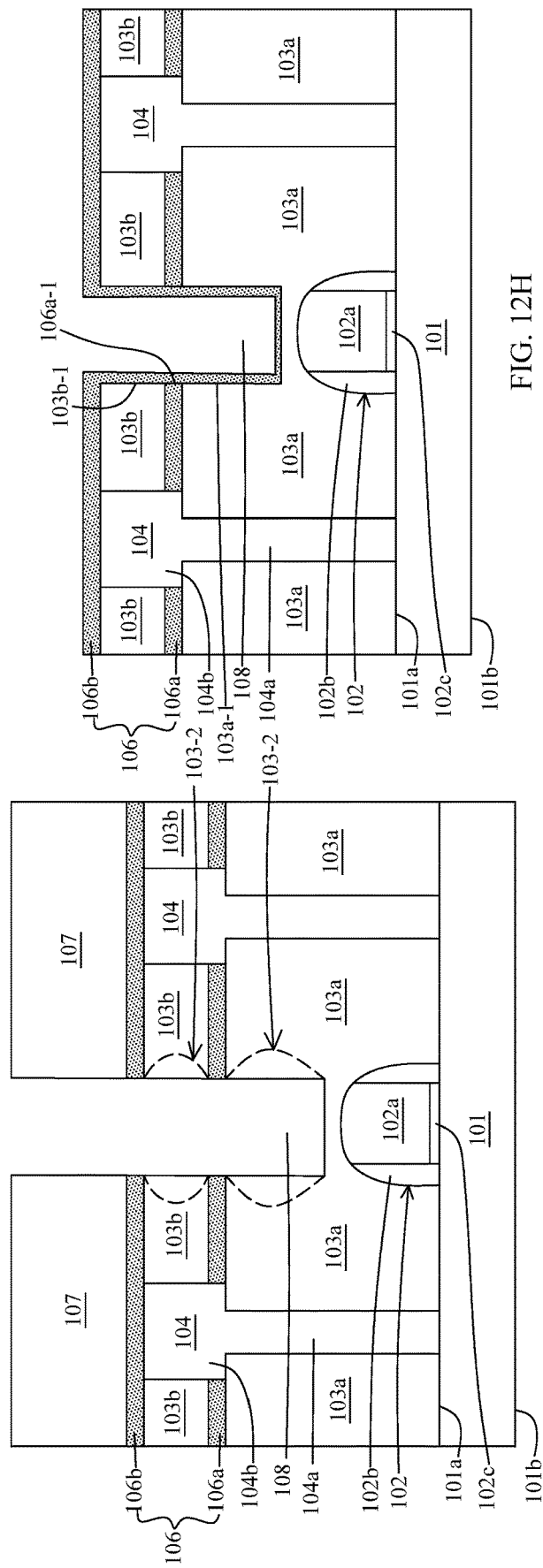

In operation 407, the first portion 103-1 (as shown in FIG. 12F) of the first dielectric layer 103a and the second dielectric layer 103b is removed as shown in FIG. 12G. In some embodiments, the first portion 103-1 exposed from the patterned mask 107 is removed. In some embodiments, the first portion 103-1 is orthogonally removed by any suitable operations such as dry etching to form a recess 108. In some embodiments, the recess 108 is extended through the first dielectric layer 103a, the first capping layer 106a, the second dielectric layer 103b and the second capping layer 106b.

In some embodiments, operation 409 and operation 410 are performed after the operation 407. In the operation 409, the patterned mask 107 is removed as shown in FIG. 12H. In some embodiments, the patterned mask 107 is removed by any suitable operations such as etching, stripping, etc. In some embodiments, the second capping layer 106b is disposed conformal to the recess 108 as shown in FIG. 12H. In some embodiments, the second capping layer 106b is disposed along the recess 108. In some embodiments, the second capping layer 106b is disposed along a sidewall 103a-1 of the first dielectric layer 103a, a sidewall 103b-1 of the second dielectric layer 103b and a sidewall 106a-1 of the first capping layer 106a. In some embodiments, some of the second capping layer 106b is surrounded by the first dielectric layer 103a and the second dielectric layer 103b.

Figure 12I:
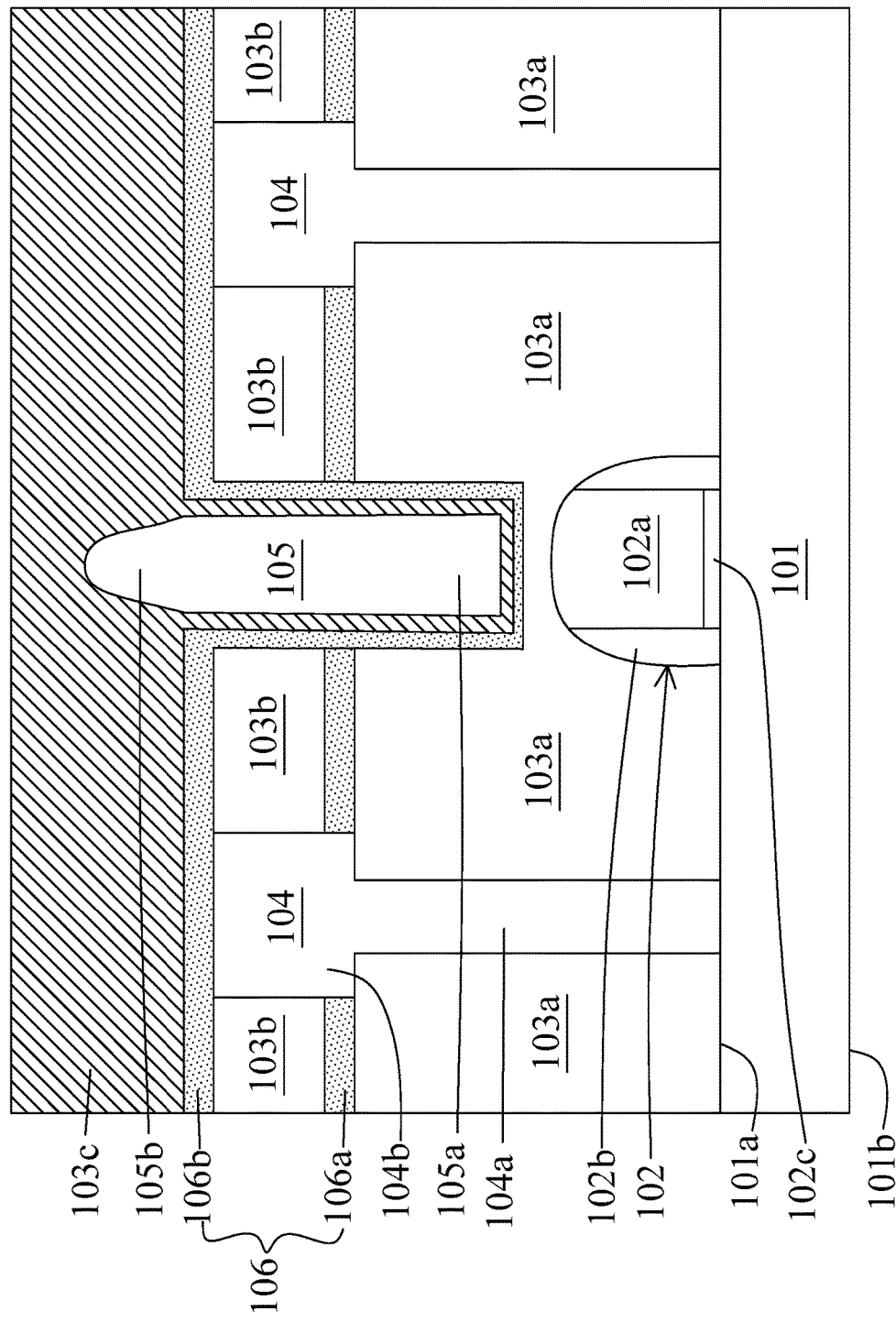

In the operation 410, a third dielectric layer 103c is disposed over the second dielectric layer 103b to form a void 105 as shown in FIG. 12I. In some embodiments, the third dielectric layer 103c is disposed conformal to the second capping layer 106b to form the void 105. In some embodiments, some of the third dielectric layer 103c is surrounded by the first dielectric layer 103a and the second dielectric layer 103b. In some embodiments, the third dielectric layer 103c is disposed by deposition operations, spinning operations, CVD operations, PECVD operations or any other suitable operations. In some embodiments, the third dielectric layer 103c has similar configuration as described above or illustrated in any one of FIGS. 6-10.

In some embodiments, the void 105 is disposed over the gate structure 102. In some embodiments, the third dielectric layer 103c is disposed conformal to the second capping layer 106b to form the void 105. In some embodiments, the void 105 is sealed and enclosed by the third dielectric layer 103c. In some embodiments, the void 105 is in vacuum or filled with air, gas or a material with dielectric constant of about 1. In some embodiments, the void 105 has similar configuration as described above or illustrated in any one of FIGS. 1-10. In some embodiments, the void 105 having a body portion 105a and a tapered end portion 105b is formed upon disposing the third dielectric layer 103c. In some embodiments, the void 105 has similar configuration as described above or illustrated in any one of FIGS. 1-10.

Figure 12K:
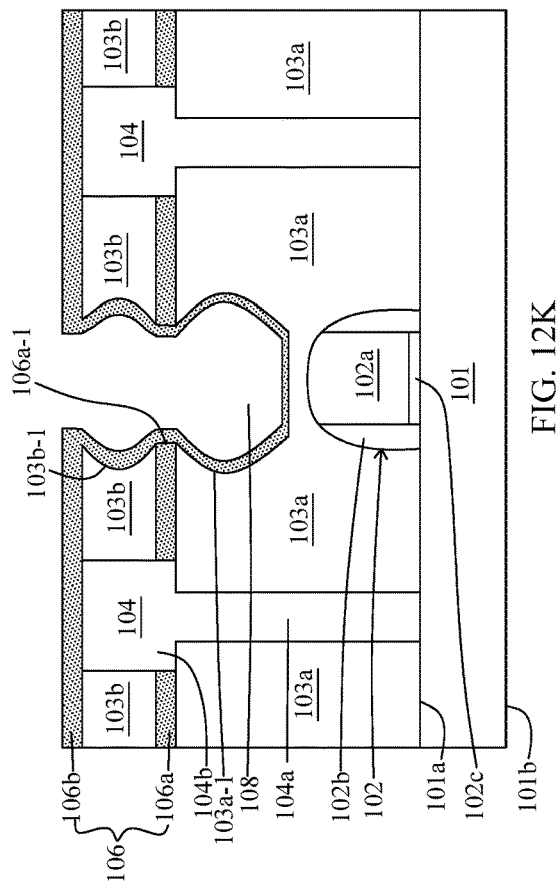
Figure 12J:
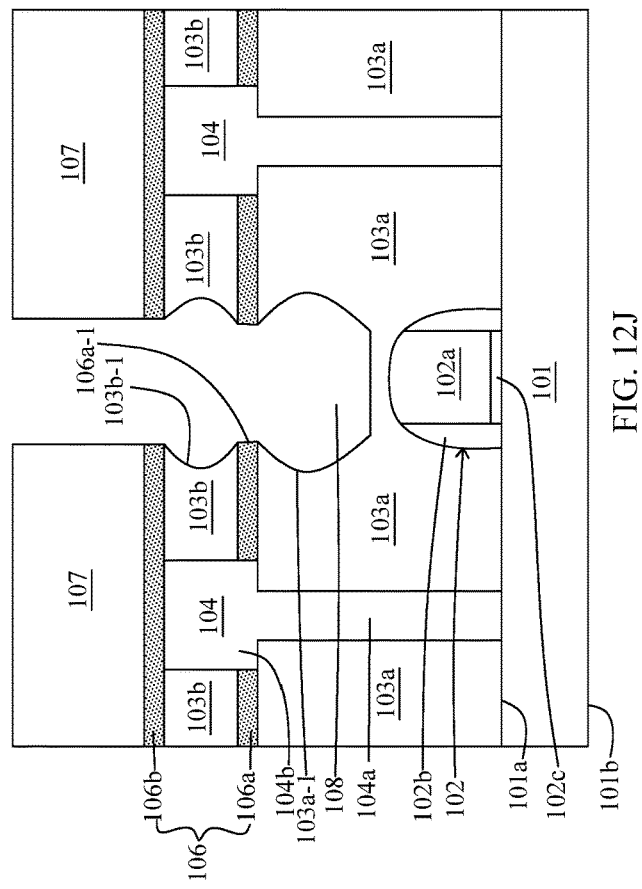

In some embodiments, operation 408 is performed after the operation 407. In some embodiments, a second portion 103-2 of the first dielectric layer 103a and the second dielectric layer 103b is covered by the patterned mask 107 after the operation 407 as shown in FIG. 12G. In the operation 408, the second portion 103-2 of the first dielectric layer 103a and the second dielectric layer 103b is removed as shown in FIG. 12J to form an enlarged recess 108. In some embodiments, the second portion 103-2 is laterally removed by any suitable operations such as wet etching, isotropic etching, etc. to form the enlarged recess 108. In some embodiments, the enlarged recess 108 has larger volume than the recess 108 after the operation 407 as shown in FIG. 12F or 12G.

In some embodiments, the operation 409 and the operation 410 are performed after the operation 408. In the operation 409, the patterned mask 107 is removed as shown in FIG. 12K. In some embodiments, the patterned mask 107 is removed by any suitable operations such as etching, stripping, etc. In some embodiments, the second capping layer 106b is disposed conformal to the enlarged recess 108 as shown in FIG. 12K. In some embodiments, the second capping layer 106b is disposed along the enlarged recess 108. In some embodiments, the second capping layer 106b is disposed along a sidewall 103a-1 of the first dielectric layer 103a, a sidewall 103b-1 of the second dielectric layer 103b and a sidewall 106a-1 of the first capping layer 106a. In some embodiments, some of the second capping layer 106b is surrounded by the first dielectric layer 103a and the second dielectric layer 103b. In some embodiments, the sidewall 103a-1 of the first dielectric layer 103a and the sidewall 103b-1 of the second dielectric layer 103b are indented into the first dielectric layer 103a and the second dielectric layer 103b respectively. In some embodiments, the sidewall 103a-1 of the first dielectric layer 103a or the sidewall 103b-1 of the second dielectric layer 103b is in a curved shape or includes a curvature. In some embodiments, the sidewall 103a-1 of the first dielectric layer 103a or the sidewall 103b-1 of the second dielectric layer 103b is curved towards the first dielectric layer 103a and the second dielectric layer 103b respectively.

Figure 12L:
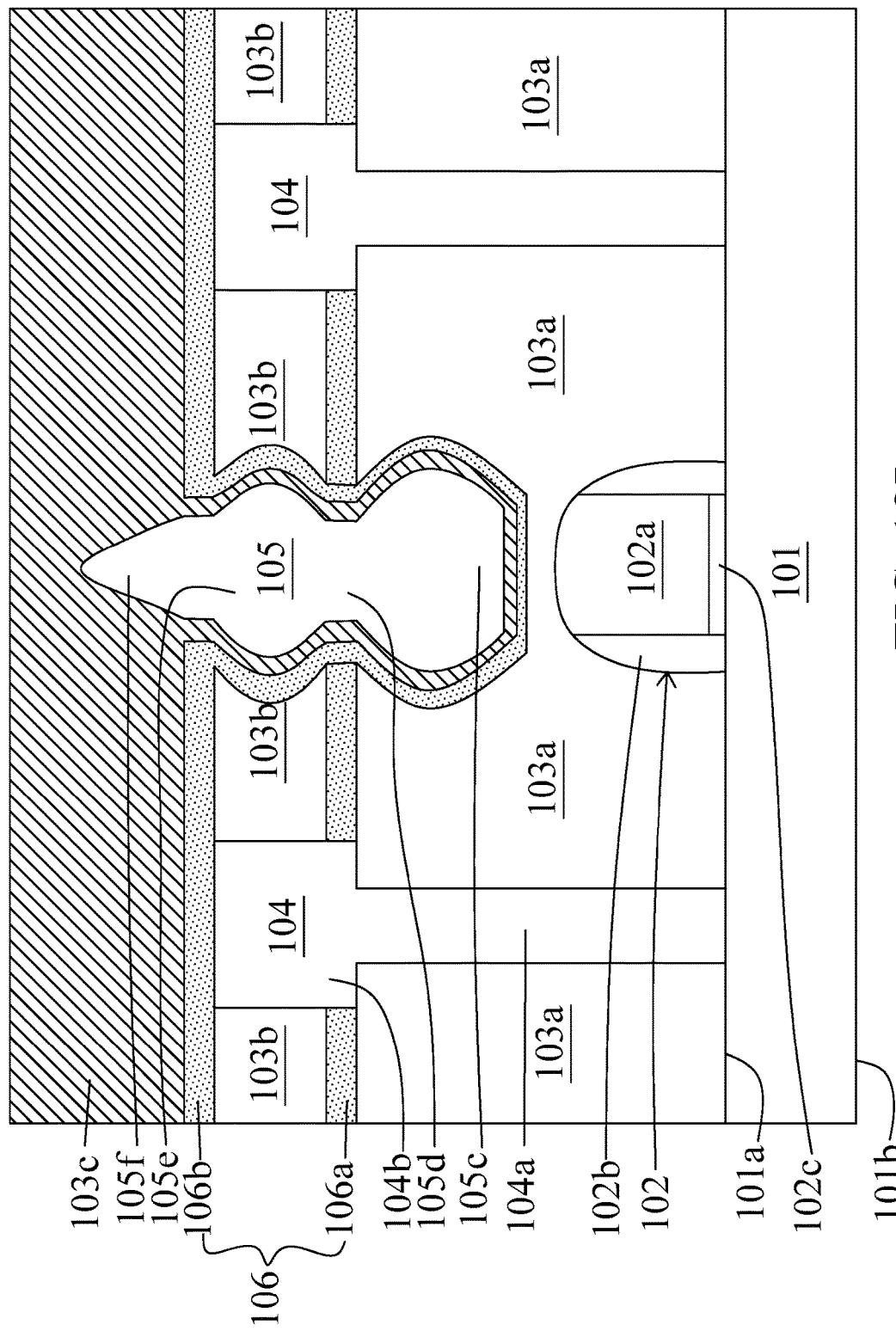

In the operation 410, a third dielectric layer 103c is disposed over the second dielectric layer 103b to form an enlarged void 105 as shown in FIG. 12L. In some embodiments, the third dielectric layer 103c is disposed conformal to the second capping layer 106b to form the enlarged void 105. In some embodiments, some of the third dielectric layer 103c is surrounded by the first dielectric layer 103a and the second dielectric layer 103b. In some embodiments, the third dielectric layer 103c is disposed by deposition operations, spinning operations, CVD operations, PECVD operations or any other suitable operations. In some embodiments, the third dielectric layer 103c has similar configuration as described above or illustrated in any one of FIGS. 6-10.

In some embodiments, the enlarged void 105 is disposed over the gate structure 102. In some embodiments, the third dielectric layer 103c is disposed conformal to the second capping layer 106b to form the enlarged void 105. In some embodiments, the enlarged void 105 is sealed and enclosed by the third dielectric layer 103c. In some embodiments, the enlarged void 105 is in vacuum or filled with air, gas or a material with dielectric constant of about 1. In some embodiments, the enlarged void 105 includes a first portion 105c, a second portion 105d, a third portion 105e and a tapered end portion 105f. In some embodiments, a volume of the first portion 105c and a volume of the third portion 105e are substantially greater than a volume of the second portion 105d.

In the present disclosure, a semiconductor structure is disclosed. The semiconductor structure includes a void disposed over a gate structure and extending within a dielectric material. The void is filled with air or is in vacuum. The present of the void can minimize parasitic capacitance within the semiconductor structure. Further, a volume of the void can be enlarged by laterally removing additional portion of the dielectric material. The enlarged void can further reduce parasitic capacitance.

In some embodiments, a semiconductor structure includes a substrate, a gate structure disposed over the substrate, a dielectric material disposed over the substrate and the gate structure, a conductive structure extending within the dielectric material, and a void extending within the dielectric material and disposed over the gate structure.

In some embodiments, the void is disposed above the gate structure. In some embodiments, the void is enclosed and sealed by the dielectric material. In some embodiments, a ratio of a width to a height of the void is substantially greater than 1:2. In some embodiments, the void includes a body portion elongated within the dielectric material and an end portion distal to the gate structure, coupled with the body portion and tapered from the body portion and away from the gate structure. In some embodiments, the void includes a first portion over the gate structure, a second portion over the first portion, and a third portion over the first portion and the second portion, the second portion is disposed between the first portion and the third portion, a width of the second portion is substantially less than a width of the first portion or a width of the third portion. In some embodiments, a width of the first portion is substantially same as a width of the third portion. In some embodiments, a width of the first portion or a width of the third portion is about 250 nm to about 450 nm, and a width of the second portion is about 80 nm to about 220 nm. In some embodiments, the conductive structure is neighbored with the gate structure and the void. In some embodiments, the conductive structure is electrically connected with the substrate or the gate structure. In some embodiments, the void is in vacuum or is filled with air or gas. In some embodiments, the gate structure is a transistor or includes polysilicon.

In some embodiments, a semiconductor structure includes a substrate, a gate structure disposed over the substrate, a first dielectric layer disposed over the substrate and the gate structure, a second dielectric layer disposed over the first dielectric layer, a conductive structure extending through and within the first dielectric layer and the second dielectric layer, a third dielectric layer disposed over the second dielectric layer and the conductive structure, and a void disposed over the gate structure and extending from the first dielectric layer to the third dielectric layer.

In some embodiments, the void includes a first portion surrounded by the first dielectric layer, a second portion disposed over the first portion and surrounded by the first dielectric layer and the second dielectric layer, a third portion disposed over the second portion and surrounded by the second dielectric layer, and an end portion disposed over the third portion and surrounded by the third dielectric layer. In some embodiments, the end portion is tapered from the second dielectric layer towards the third dielectric layer. In some embodiments, a volume of the second portion is substantially less than a volume of the first portion or a volume of the third portion. In some embodiments, the semiconductor structure further includes a first capping layer disposed between the first dielectric layer and the second dielectric layer, or a second capping layer disposed between the second dielectric layer and the third dielectric layer and disposed conformal to a sidewall of the first dielectric layer or a sidewall of the second dielectric layer.

In some embodiments, a method of manufacturing a semiconductor structure includes receiving a substrate, forming a gate structure over the substrate, disposing a dielectric material over the substrate and the gate structure, forming a conductive structure extending within the dielectric material, forming a void disposed over the gate structure and extending within the dielectric material.

In some embodiments, the method further includes disposing a patterned mask over the dielectric material, orthogonally removing a first portion of the dielectric material exposed from the patterned mask, laterally removing a second portion of the dielectric material covered by the patterned mask, removing the patterned mask from the dielectric material. In some embodiments, the first portion of the dielectric material is removed by dry etching operations, or the second portion of the dielectric material is removed by wet etching operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a substrate;
a dielectric material disposed over the substrate;
a void extending within the dielectric material;
a dielectric liner disposed along inner sidewalls of the dielectric material proximate to the void, wherein an inner surface of the dielectric liner defines an outer extent of the void, and wherein the dielectric liner includes an inner liner layer and an outer liner layer; and
a gate structure disposed over the substrate beneath the void.

2. The semiconductor structure of claim 1, wherein the gate structure is disposed directly beneath the void.

3. The semiconductor structure of claim 1, wherein the inner liner layer is a first conformal layer that defines outer lateral extends of the void and that defines a lower extent of the void.

4. The semiconductor structure of claim 3, wherein the outer liner layer is a second conformal layer that separates the inner liner layer from the dielectric material.

5. The semiconductor structure of claim 1, further comprising:
a plurality of conductive structures extending within the dielectric material, at least one of the conductive structures comprising a plug portion and a top metal portion on the plug portion, wherein a width of the top metal portion is greater than a width of the plug portion.

6. The semiconductor structure of claim 5, wherein the void includes a first void portion corresponding to a height of the plug portion and a second void portion corresponding to a height of the top metal portion.

7. The semiconductor structure of claim 1, wherein the void comprises:
a first void portion having a first width,
a second void portion over the first void portion and having a second width, and
a third void portion over the second void portion and having a third width,
wherein the second width is less than the first width and is less than the third width, and wherein the void tapers continuously inward from the third width until terminating at an uppermost extent of the void.

8. A semiconductor structure, comprising:
a substrate;
a first dielectric layer disposed over the substrate;
a second dielectric layer disposed over the first dielectric layer;
a third dielectric layer disposed over the second dielectric layer, wherein a portion of the third dielectric layer extends to a depth within the first dielectric layer to laterally surround a void, the void extending from the first dielectric layer to the third dielectric layer; and
a dielectric liner disposed along inner sidewalls of the first dielectric layer and along inner sidewalls of the second dielectric layer, the dielectric liner surrounding a first portion of the void within the first dielectric layer and surrounding a second portion of the void within the second dielectric layer.

9. The semiconductor structure of claim 8, wherein the dielectric liner is a first conformal layer that defines a lower extent of the first portion of the void and that defines outer lateral extents of the first portion of the void and the second portion of the void.

10. The semiconductor structure of claim 9, wherein the third dielectric layer separates the first conformal layer from the first dielectric layer and from the second dielectric layer.

11. The semiconductor structure of claim 8, wherein the third dielectric layer defines a lower extent of the first portion of the void, defines an outer lateral extent of the first portion of the void, and defines an outer lateral extent of the second portion of the void; and wherein the dielectric liner separates the third dielectric layer from the first dielectric layer and from the second dielectric layer.

12. The semiconductor structure of claim 8, further comprising:
a gate structure disposed over the substrate and beneath the third dielectric layer, wherein the void is disposed directly over the gate structure.

13. The semiconductor structure of claim 8, wherein an upper extent of the void extends over the second dielectric layer and tapers continuously inward until reaching an apex of the void.

14. The semiconductor structure of claim 8, wherein a ratio of a width to a height of the void is substantially greater than 1:2.

15. The semiconductor structure of claim 8, wherein the void includes a waist portion between the first portion of the void and the second portion of the void such that a width of the first portion of the void or the second portion of the void is about 250 nm to about 450 nm, and a width of the waist portion of the void is about 80 nm to about 220 nm.

16. A semiconductor structure, comprising:
a substrate;
a gate structure disposed over the substrate;
a first dielectric layer disposed over the substrate and directly contacting the gate structure;
a second dielectric layer disposed over the first dielectric layer;
a plurality of conductive structures provided within the first dielectric layer and the second dielectric layer;
a third dielectric layer disposed over the second dielectric layer and the plurality of conductive structures; and
a void disposed over the gate structure and including a lowermost void portion in the first dielectric layer, an intermediate void portion in the second dielectric layer, and an uppermost void portion disposed in the third dielectric layer, the uppermost void portion tapering continuously inwardly from the intermediate void portion until terminating at an apex in the third dielectric layer.

17. The semiconductor structure of claim 16, further comprising:
   a conformal dielectric liner extending along the first dielectric layer and the second dielectric layer to laterally surround the lowermost void portion and the intermediate void portion.

18. The semiconductor structure of claim 16, wherein the third dielectric layer includes a portion that extends down along inner sidewalls of the first dielectric layer and along inner sidewalls of the second dielectric layer to define outer extents of the void.

19. The semiconductor structure of claim 18, further comprising:
   a conformal dielectric liner extending along inner sidewalls of the portion of the third dielectric layer to laterally surround the lowermost void portion and the intermediate void portion and to separate the portion of the third dielectric layer from the first dielectric layer and the second dielectric layer.

20. The semiconductor structure of claim 16, wherein the void is directly over the gate structure.

* * * * *